US011171057B2

(12) United States Patent
Glass et al.

(10) Patent No.: US 11,171,057 B2
(45) Date of Patent: Nov. 9, 2021

(54) SEMICONDUCTOR FIN DESIGN TO MITIGATE FIN COLLAPSE

(71) Applicant: INTEL CORPORATION, Santa Clara, CA (US)

(72) Inventors: Glenn A. Glass, Portland, OR (US); Chytra Pawashe, Beaverton, OR (US); Anand S. Murthy, Portland, OR (US); Daniel Pantuso, Portland, OR (US); Tahir Ghani, Portland, OR (US)

(73) Assignee: Intel Corporation, Santa Clara, CA (US)

(*) Notice: Subject to any disclaimer, the term of this patent is extended or adjusted under 35 U.S.C. 154(b) by 86 days.

(21) Appl. No.: 16/465,490

(22) PCT Filed: Dec. 30, 2016

(86) PCT No.: PCT/US2016/069368
§ 371 (c)(1),
(2) Date: May 30, 2019

(87) PCT Pub. No.: WO2018/125179
PCT Pub. Date: Jul. 5, 2018

(65) Prior Publication Data
US 2020/0066595 A1 Feb. 27, 2020

(51) Int. Cl.
*H01L 21/82* (2006.01)
*H01L 21/8234* (2006.01)
(Continued)

(52) U.S. Cl.
CPC .. *H01L 21/823431* (2013.01); *H01L 27/0886* (2013.01); *H01L 29/0657* (2013.01)

(58) Field of Classification Search
CPC ............................................. H01L 21/823431
See application file for complete search history.

(56) References Cited

U.S. PATENT DOCUMENTS

2007/0108536 A1* 5/2007 Ieong ................... H01L 21/845
257/401
2008/0179683 A1* 7/2008 Sasaki ............... H01L 29/78621
257/368
(Continued)

FOREIGN PATENT DOCUMENTS

WO 2018063277 A1 4/2018
WO 2018125179 A1 7/2018

OTHER PUBLICATIONS

International Search Report and Written Opinion received for PCT/US2016/069368 dated Sep. 14, 2017. 10 pages.
(Continued)

*Primary Examiner* — Thao X Le
*Assistant Examiner* — Laura M Dykes
(74) *Attorney, Agent, or Firm* — Schwabe, Williamson & Wyatt, P.C.

(57) ABSTRACT

Fin-based transistor structures, such as finFET and nanowire transistor structures, are disclosed. The fins have a morphology including a wave pattern and/or one or more ridges and/or nodules which effectively mitigate fin collapse, by limiting the inter-fin contact during a fin collapse condition. Thus, while the fins may temporarily collapse during wet processing, the morphology allows the collapsed fins to recover back to their uncollapsed state upon drying. The fin morphology may be, for example, an undulating pattern having peaks and troughs (e., sine, triangle, or ramp waves). In such cases, the undulating patterns of neighboring fins are out of phase, such that inter-fin contact during fin collapse is limited to peak/trough contact. In other embodiments, one or more ridges or nodules (short ridges), depending on the length of the fin, effectively limit the amount of inter-fin contact during fin collapse, such that only the ridges/nodules contact the neighboring fin.

20 Claims, 11 Drawing Sheets

(51) Int. Cl.
    *H01L 27/088*     (2006.01)
    *H01L 29/06*     (2006.01)

(56)     References Cited

U.S. PATENT DOCUMENTS

| | | |
|---|---|---|
| 2012/0280354 A1 | 11/2012 | Moroz et al. |
| 2013/0049069 A1* | 2/2013 | Zhu .................... H01L 29/1054 257/192 |
| 2014/0131813 A1* | 5/2014 | Liaw .................... H01L 29/0657 257/401 |
| 2014/0206197 A1* | 7/2014 | Nakagawa ........ H01J 37/32458 438/712 |
| 2014/0353735 A1* | 12/2014 | Basker ............ H01L 21/823431 257/288 |
| 2015/0069505 A1 | 3/2015 | Parekh et al. |
| 2016/0111553 A1 | 4/2016 | Basker et al. |
| 2016/0190303 A1 | 6/2016 | Liu et al. |
| 2016/0190325 A1* | 6/2016 | Liu ...................... H01L 29/785 257/401 |
| 2016/0211379 A1* | 7/2016 | You .................... H01L 29/0649 |
| 2016/0343734 A1 | 11/2016 | Doris et al. |
| 2017/0047326 A1* | 2/2017 | You .................... H01L 27/0886 |

OTHER PUBLICATIONS

International Preliminary Report on Patentability received for PCT/US2016/069368. dated Jul. 2, 2019. 7 pages.

\* cited by examiner

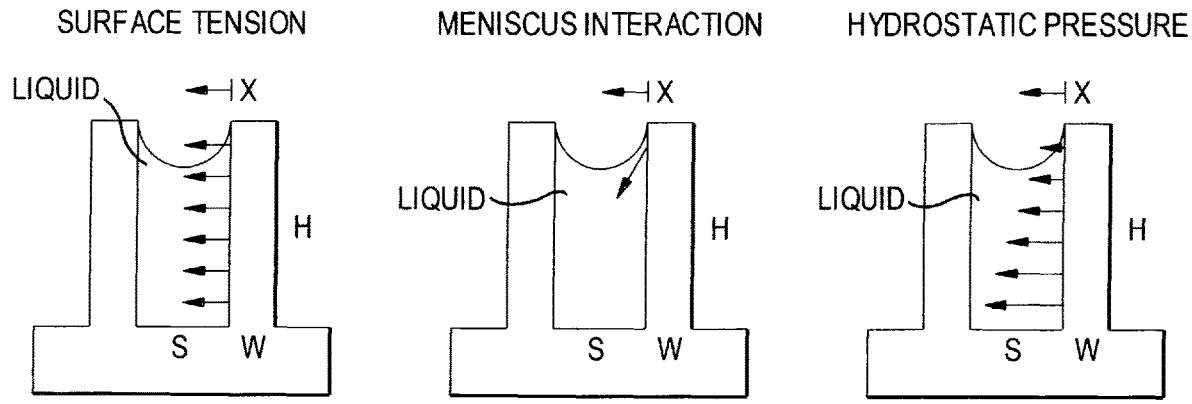
FIG. 3A  FIG. 3B  FIG. 3C
$$x = \frac{3L^4}{3Edw^3}\gamma\cos\Theta + \gamma\sin\Theta + \rho g \frac{L^5}{4Ew^3}$$
X: FIN DEFLECTION
IF X > 1/2 D, TWO NEIGHBORING FINS CAN BE BROUGHT INTO CONTACT
FIG. 3D
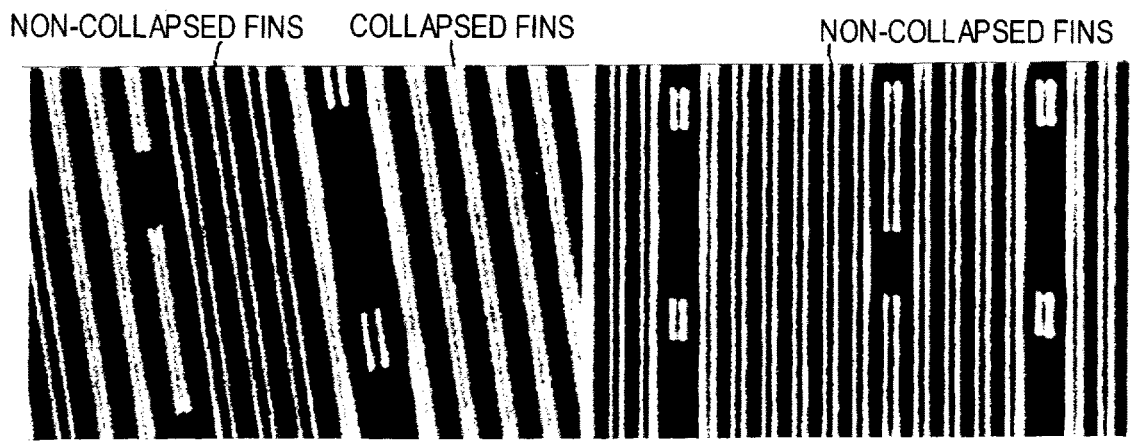
FIG. 5A  FIG. 5B

UNCOLLAPSED FINS

COLLAPSED FINS

UNCOLLAPSED FINS

COLLAPSED FINS

SEMICONDUCTOR FIN DESIGN TO MITIGATE FIN COLLAPSE

CROSS-REFERENCE TO RELATED APPLICATIONS

This patent application is a U.S. National Phase Application under 35 U.S.C. § 371 of International Application No. PCT/US2016/069368, filed on Dec. 30, 2016, the entire contents of which is hereby incorporated by reference herein.

BACKGROUND

A field-effect transistor (FET) is a semiconductor device that generally includes a gate, a source, and a drain. In operation, a FET uses an electric field applied to the gate to control the electrical conductivity of a channel through which charge carriers (e.g., electrons or holes) flow from the source to the drain. A gate dielectric is used to separate the gate from other regions of the FET, including the source and drain as well as the channel that connects source and drain when the transistor is biased to an on or otherwise conductive state (as opposed to an off-state or non-conductive state). FETs can be implemented in both planar and non-planar architectures. For instance, a finFET is a non-planar transistor built around a thin strip of semiconductor material (generally referred to as a fin). A finFET includes the standard FET nodes, including a gate, a gate dielectric, a source, and a drain. The conductive channel of the device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a finFET design is sometimes referred to as a tri-gate transistor. Another type of finFET is the so-called double-gate finFET configuration, in which the conductive channel principally resides only along the two sidewalls of the fin (and not along the top of the fin). Another non-planar transistor configuration is sometimes referred to as a nanowire configuration, which is configured similarly to a fin-based transistor, but instead of a finned channel region, one or more nanowires (or nanoribbons, depending on aspect ratio) are used and the gate material generally surrounds each nanowire. Such nanowire configurations are sometimes called gate-all-around FETs. The source and drain regions may also include one or more nanowires, in some example configurations. For any such configurations, and as will be appreciated in light of this disclosure, fin collapse is an issue.

BRIEF DESCRIPTION OF THE DRAWINGS

FIGS. 3A-3C are illustrations of surface tension, meniscus interaction, and hydrostatic pressure that act on fins to cause fin collapse.

FIG. 3D illustrates the mathematical equation used to calculate fin deflection based upon surface tension, meniscus interaction and hydrostatic pressure on the fins.

FIG. 5A illustrates a SEM image of an integrated circuit structure with some permanent fin collapse, and FIG. 5B illustrates a SEM image of an integrated circuit structure where each of the fins is in a non-collapsed state.

FIGS. 6A and 6B illustrate perspective views of example fins patterned to mitigate fin collapse by virtue of reduced inter-fin contact, in accordance with an embodiment of the present disclosure, wherein FIG. 6A shows the fins in an uncollapsed state and FIG. 6B shows the fins in a temporary collapsed state.

FIGS. 7A and 7B illustrate perspective views of example fins patterned to mitigate fin collapse by virtue of reduced inter-fin contact, in accordance with another embodiment of the present disclosure, wherein FIG. 7A shows the fins in an uncollapsed state and FIG. 7B shows the fins in a temporary collapsed state.

Figure 1A:
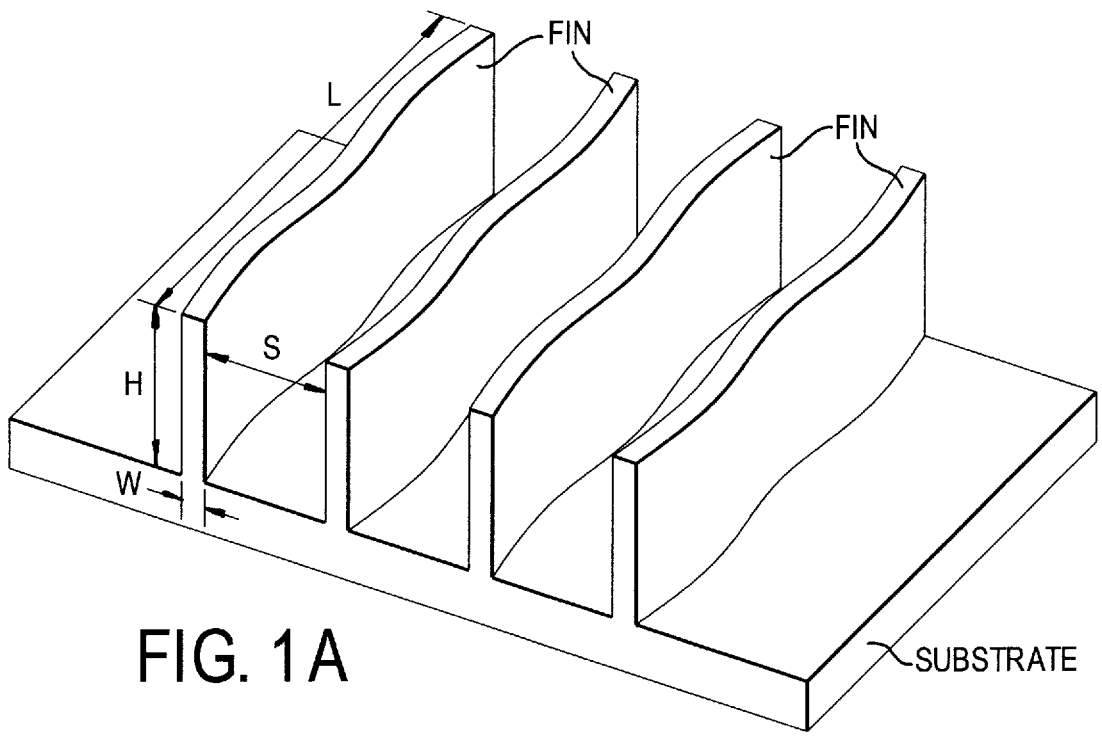
FIGS. 1A-1E illustrate different fin-based integrated circuit structures in which the fin is patterned or otherwise shaped to mitigate fin collapse, in accordance with various embodiments of the present disclosure.

As will be appreciated, the figures are not necessarily drawn to scale or intended to limit the claimed scope to the specific configurations shown. For instance, while some figures generally indicate straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Fin-based transistor structures, such as finFET and nanowire transistor structures, are disclosed. The fins have a morphology including a wave pattern and/or one or more ridges/nodules which effectively mitigate fin collapse, by limiting the inter-fin contact during a fin collapse condition. Thus, while the fins may temporarily collapse during wet processing, the morphology allows the collapsed fins to recover back to their uncollapsed state upon drying. The fin morphology may be, for example, an undulating pattern having peaks and troughs (e.g., sine, triangle, or ramp waves). In such cases, the undulating patterns of neighboring fins are out of phase, such that during fin collapse only the peaks of one fin contact the troughs of the neighboring fin, thereby considerably reducing the contact between the neighboring fins during a collapse condition. In other embodiments, one or more ridges or nodules, depending on the length of the fin, effectively limit the amount of inter-fin contact during fin collapse, such that only the ridges/nodules contact the neighboring fin, while areas in between the nodules do not contact each other.

General Overview

In 3-D transistors such as finFETs, finned TFETs, and gate-all-around transistors among others, a semiconductor fin is the initial building block that the entire device design is built upon. Conventionally, fins are patterned as straight lines. When these fins are patterned with narrow widths, small line-to-line spacing, and tall heights, the device performance and device packing factor may improve, but the mechanical spring stiffness of the fins decreases. As a result, surface tension forces present when the fin structure is submerged in wet-clean solution processing (e.g., anything involving liquid or dense vapor) are more likely to cause bending of two neighboring fins thereby causing the fins to contact each other. Note that the contact is essentially a continuous line of contact between the two fins, or may even include a greater surface area of contact, depending on the fin flexibility and size. With such a continuous contact interface between the collapsed fins, interfacial adhesive forces are more able to keep the fins in the collapsed fin state after drying, thus effectively resulting in permanent collapse of the fins. This collapsing phenomenon is further exacerbated in the case of a lower stiffness narrow/tall/densely spaced fin with lower spring restoring force. Previous and current process generations use fins that are at least one of short, fat, and spaced far enough apart that fin collapse is avoided. Such solutions, however, limit scalability beyond a certain point, as will be appreciated.

Thus, fin-based semiconductor structures, such as finFET and nanowire transistor configurations, are disclosed that decrease the fraction of fin length that is in contact in the collapsed state of two neighboring fins, and thus decrease the interfacial adhesive force. This in turn decreases the likelihood that the fins remain trapped in a collapsed state following a wet processing step. The techniques can be employed in any number of integrated circuit transistor fabrication processes, such as metal oxide semiconductor (MOS) transistor, tunnel FET (TFET), and fermi-filter FET processes, to name a few examples. An integrated circuit device according to an embodiment includes a plurality of fins extending from a substrate. The fins may be native to the substrate, or not. In any case, the fins have a morphology including a wave pattern and/or one or more nodules which effectively mitigate fin collapse, by limiting the inter-fin contact during a fin collapse condition. Thus, while the fins may temporarily collapse during the fabrication process, the morphology allows the collapsed fins to recover back to their uncollapsed state. The fin morphology may be, for example, a sine wave, a triangle wave, a ramp wave, or other undulating pattern having peaks and troughs. The undulating patterns of neighboring fins are out of phase, such that during fin collapse only the peaks of one fin contact the troughs of the neighboring fin, thereby considerably reducing the contact between the neighboring fins during a collapse condition. In still other embodiments, the fin morphology may include one or more ridges or nodules, depending on the length of the fin, such that during fin collapse only the ridges/nodules contact the neighboring fin rather than the fin area between the nodules. In still other embodiments, a combination of an undulating pattern and one or more ridges or nodules can be used. Numerous fin morphologies will be apparent in light of this disclosure.

Architecture

Figure 1B:
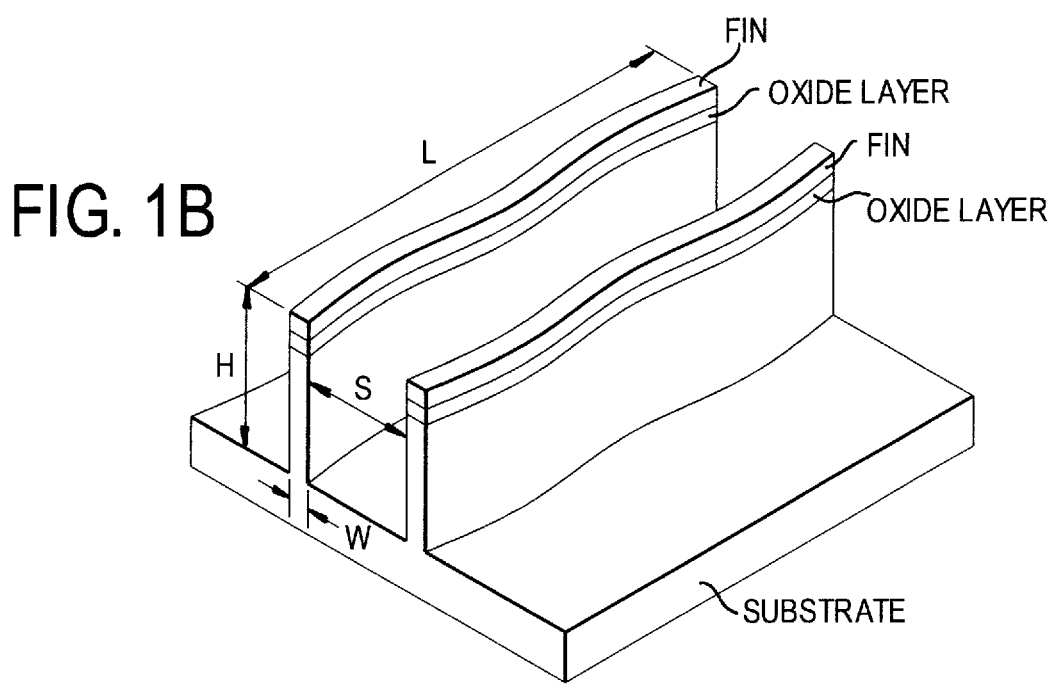
Figure 1C:
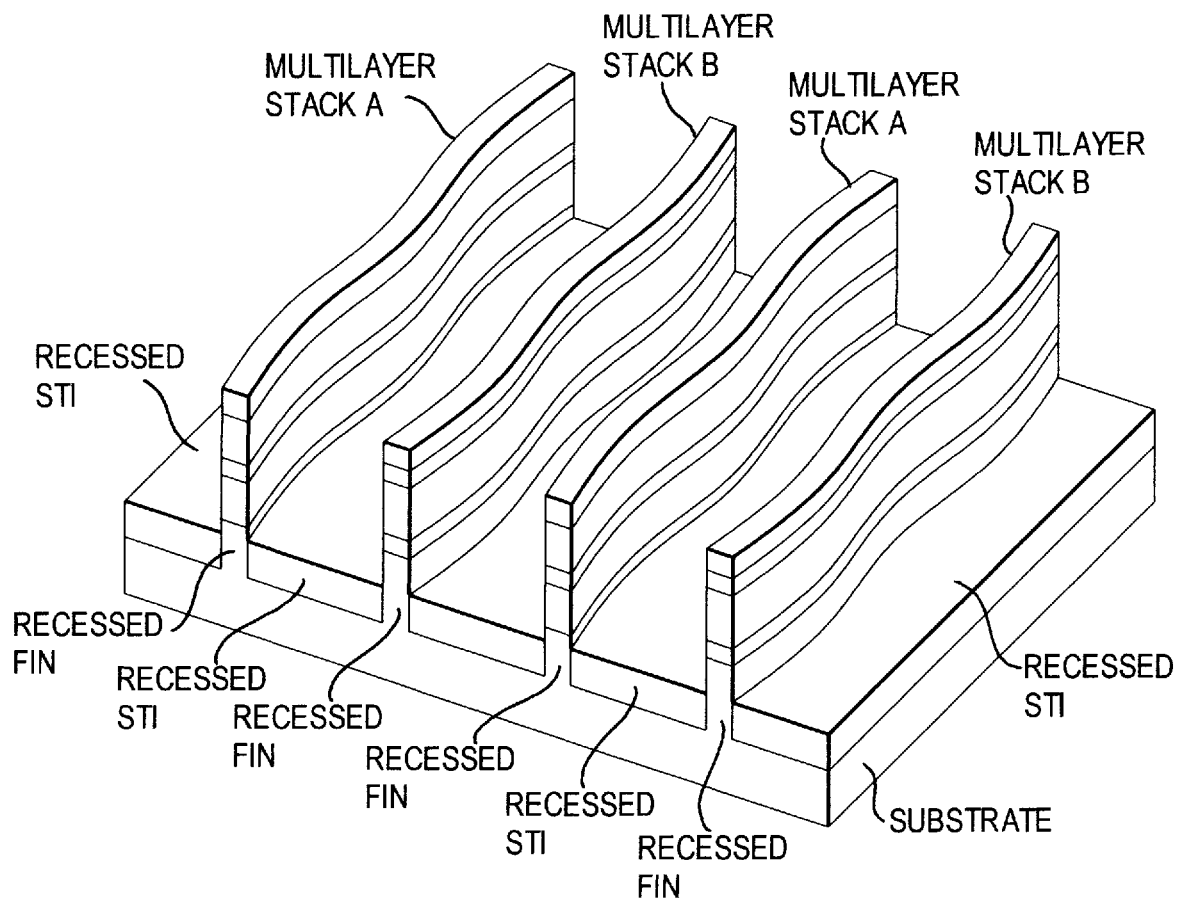
Figure 1D:
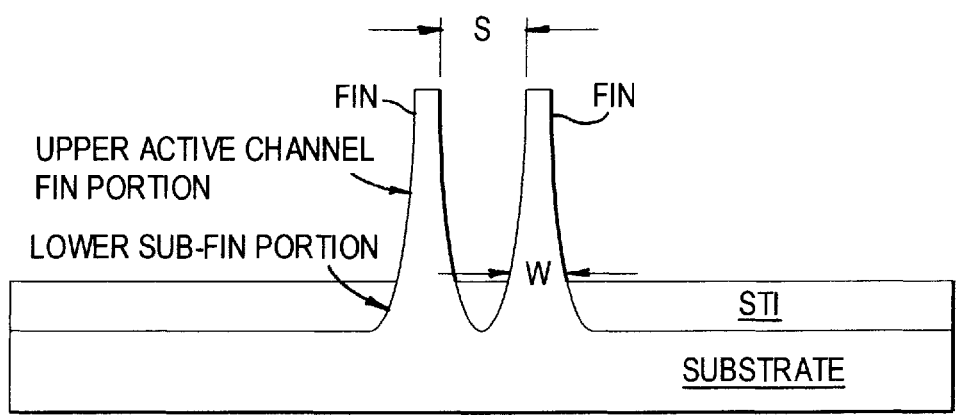

FIGS. 1A-1E illustrate integrated circuit structures having various fin configurations, as well as a morphology that mitigates fin collapse, in accordance with various embodiments of the present disclosure. Some of the fins are shown perfectly rectangular but they need not be perfect. In reality, the base of the fin is typically wider than the top, as shown in FIG. 1D. As shown, in each embodiment, the integrated circuit structure includes a substrate and a plurality of fins extending from the substrate. In general, any desired fin materials and formation processes can be used. In one particular embodiment, the fins are patterned and etched from the substrate, such that the fins are native to the substrate (e.g., silicon fins extending from a bulk silicon substrate). Alternatively, the fins may be formed using an aspect ratio trapping (ART) process, where sacrificial fins native to the substrate are formed and then removed and replaced with desired fin material(s) such as a continuous fin material or a multilayer stack of different fin materials (e.g., silicon germanium fins extending from a bulk silicon substrate). The substrate can be, for example, bulk silicon (Si) or germanium (Ge), bulk silicon germanium (SiGe), silicon on insulator (SOI), or germanium on insulator (GOI), or bulk III-V compound such as gallium arsenide (GaAs), to name a few example substrates. In a more general sense, the substrate can be any suitable platform within which or on which semiconductor fins can be formed. Numerous configurations will be appreciated.

As shown in FIGS. 1A and 1B, each fin has a wave-like morphology (sine wave, in this example case), although other morphologies configured to mitigate fin collapse will be apparent in light of this disclosure. As can be further seen, each fin has a fin height H, a fin width W, and a fin length L. As shown, the fin length L is longer than the fin width W. In addition, each structure has a fin spacing S which is defined as the distance between facing sidewalls of neighboring fins. FIG. 1A is an example embodiment of fins that are native to a bulk substrate such that they are a continuous extension of the substrate with no seam. FIG. 1B is an example embodiment where a lower portion of each fin is native to the substrate but an upper portion of the fin includes one or more epitaxial layers. For instance, the example embodiment illustrated in FIG. 1B includes an oxide layer in the fins that originates from the substrate wafer being a SOI structure. The oxide layer inhibits sub-fin leakage. Other embodiments may be formed with so-called replacement fins, where one or more desired fin material layers are deposited into a fin trench during an aspect ratio trapping process (ART), as will be apparent. In a more general sense, any fin configuration can employ the techniques provided herein.

FIG. 1C illustrates an integrated circuit structure which the sine-wave shaped fins are configured to provide nanowires. One example of a nanowire transistor configuration is discussed in greater detail in U.S. Pat. No. 9,343,559 titled "Nanowire Transistor Devices and Forming Techniques" and assigned to Intel Corporation. In general, the structure is formed where a trench oxide or other shallow trench isolation (STI) material of the structure is recessed, after the multilayer fin stacks have been provided by an ART-based process. This process can be carried out, for example, by masking the finished multilayer stacks A and B and etching the STI to a suitable depth, or without masking by using a selective etch scheme. Any suitable etch process (e.g., wet and/or dry) can be used. For instance, in one specific example embodiment, wherein the STI is implemented with silicon dioxide and each of the top layers of the multilayers stacks A and B is implemented with silicon, the STI recess process can be carried out using hydrofluoric acid or other suitable etchant that is selective to the non-STI material. As will be appreciated, a mask that is impervious or otherwise suitably resistant to the STI etchant can be patterned to protect the multilayer stacks A and B, if necessary. The depth of the STI recess can vary from one embodiment to the next, and in this example embodiment is flush with the top of the remaining original/native fin material (generally referred to as a pedestal). The depth of the STI recess will depend on factors such as the number of wires and/or ribbons per transistor (or the height of the channel portion of the fin, which is generally the portion above the STI), STI thickness and desired isolation, and/or fin height.

Figure 1E:
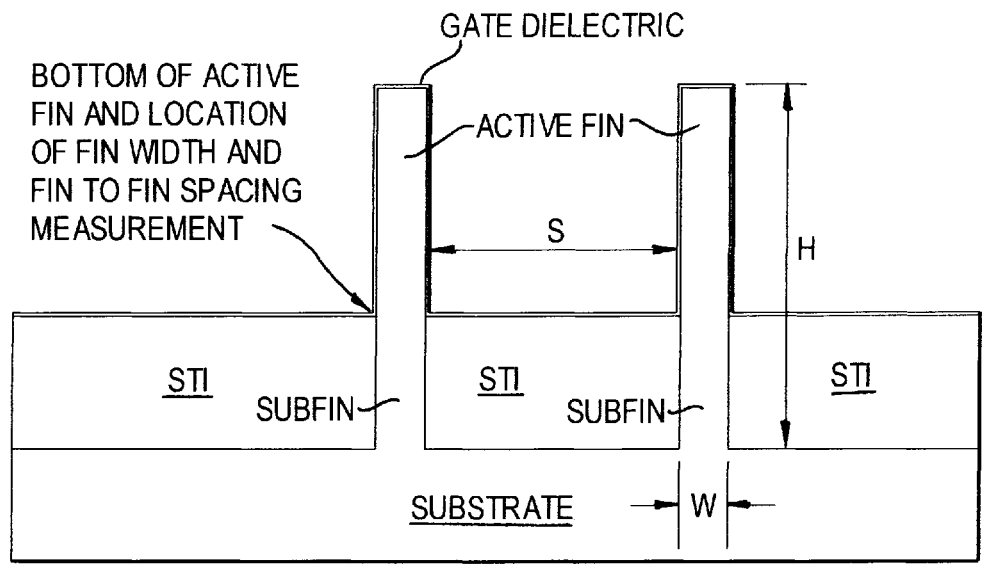

FIG. 1D illustrates a vertical cross-section slice of an integrated circuit structure that includes undulating fins having a non-uniform width, according to some embodiments. The cross-section is taken perpendicular to the fins and through the channel region. As can be seen, the fins are tapered in that they are narrower at the top than at the bottom. In addition, in this example configuration, there is an STI (shallow trench isolation) layer deposited over the substrate. Each fin includes a lower sub-fin portion within the STI and an upper channel portion above the STI. The overall fin height includes the height of the channel portion and the height of the sub-fin portion. The insulation material (such as STI) has a height to just below the lowermost portion of the channel portion of the fins so as to cover the sub-fin portion but not the channel portion. As illustrated, in this embodiment, the fin width W is a distance between laterally opposite sidewall surfaces of the fin at the lowermost portion of the channel portion of the fin. In one embodiment, the spacing S between any two neighboring fins is measured between respective sidewall surfaces of the two neighboring fins at an uppermost portion of the fins. As shown in FIG. 1E discussed below, in another embodiment, the spacing S between any two neighboring fins is measured between respective sidewall surfaces of two neighboring fins at the lowermost portion of the channel portion of the fin.

FIG. 1E illustrates another vertical cross-section slice of an integrated circuit structure that includes undulating fins, according to some embodiments. Like FIG. 1D, the cross-section is taken perpendicular to the fins and through the channel region. As can be seen, there is an STI (shallow trench isolation) layer deposited over the substrate. Each fin includes a lower sub-fin portion within the STI and an active fin portion (channel portion) above the STI (by operation of an STI recess, for instance). There is a gate dielectric on top of the STI layer and around the channel portion of the fins. As will be further appreciated, the completed structure will include a gate electrode deposited over the fins. The overall fin height H includes the height of the active fin portion (channel portion) and the height of the sub-fin portion. The active portion of the fin is defined as the portion that is wrapped by gate dielectric. As illustrated, in this embodiment, the fin width W is a distance between laterally opposite sidewall surfaces of the fin at the lowermost portion of the channel portion of the fin. As also illustrated, in this embodiment, the spacing S between any two neighboring fins is measured between respective sidewall surfaces of two neighboring fins at the lowermost portion of the channel portion of the fin.

Figure 2:
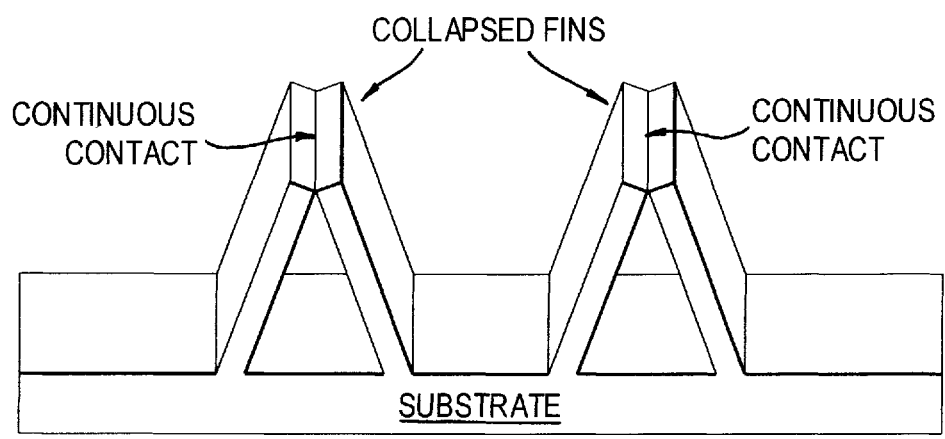
FIG. 2 illustrates an integrated circuit structure with fins that have collapsed.

FIG. 2 illustrates the undesirable occurrence of fin collapse. After the fins are formed, a series of wet processing steps may occur to prepare the fins for shallow trench isolation (STI). If aqueous based chemistry is used for the wet processing techniques, the fins may bend over or otherwise yield in response to surface tension forces (e.g., adhesion forces and/or cohesive forces) of the neighboring fins. In particular, as shown in FIG. 2, adjacent fins collapse towards one another such that two adjacent fins contact each other along a top line of the fins. In some instances, particularly with longer, taller fins, the contact line may become a larger area of inter-fin contact. This condition, when unmitigated, leads to massive device yield loss.

FIGS. 3A-3C are illustrations of surface tension, meniscus interaction, and hydrostatic pressure that act on fins, and FIG. 3D illustrates the mathematical equation used to simulate the resulting fin deflection. A contact angle of 45° is used in these simulations for aqueous wet-clean chemicals. As shown, fin deflection "x" may be caused by surface tension, meniscus interaction and hydrostatic pressure. If the fin deflection "x" equals ½ of the fin spacing S, then two neighboring fins can be brought into contact with each other, causing fin collapse. By reducing one or more of the surface tension, meniscus interaction and the hydrostatic pressure, fin collapse can be avoided or mitigated. Hydrostatic pressure can be neglected.

Figure 4A:
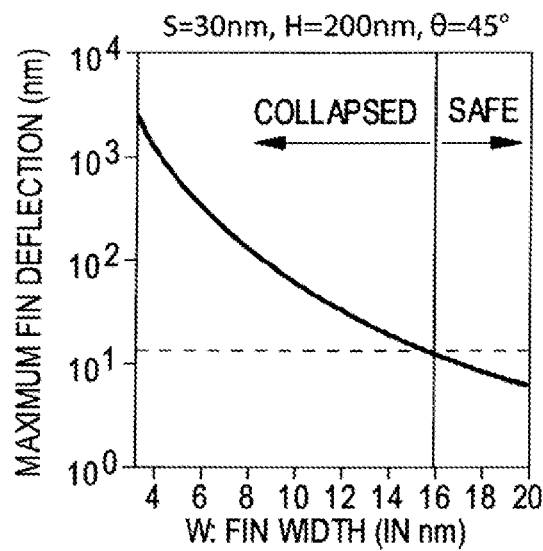
FIGS. 4A-4C are graphical illustrations depicting example conditions in which permanent fin collapse occurs with a fin-based transistor device when the fins are not patterned to reduce inter-fin contact during collapse, as variously discussed herein.
Figure 4B:
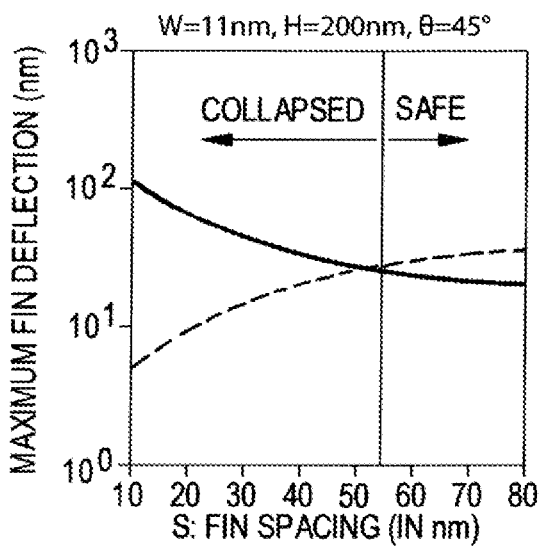
Figure 4C:
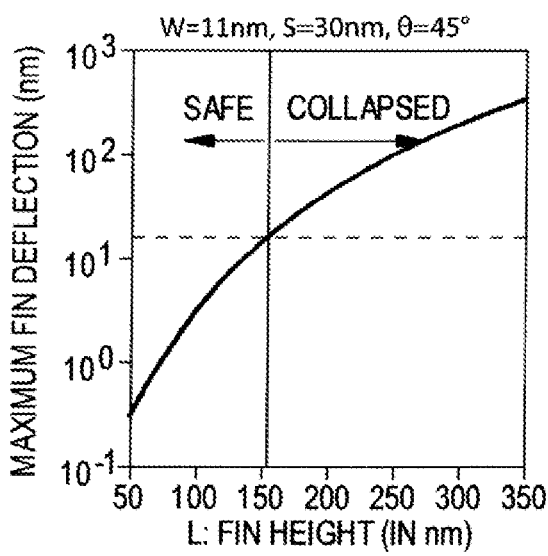

FIGS. 4A-4C are graphical illustrations depicting example conditions in which permanent fin collapse occurs with a fin-based transistor device when the fins are not patterned to reduce inter-fin contact during collapse, as variously discussed herein. As can be seen, the fin dimensions include "W" (distance between laterally opposite sidewall surfaces of the fin at the lowermost portion of the channel portion of the fin), the total fin height "H", and the spacing "S" between any two neighboring fins as measured between respective sidewall surfaces of the two neighboring fins at the lowermost portion of the channel portion (see, for example, FIG. 1E). The contact angle "θ" generally refers to the acute angle between the two fins, in the collapsed state. As will be further appreciated in light of this disclosure, note fin collapse is more prone to occur when the fin length "L" is decreased, fin width "W" is decreased, and fin spacing "S" is decreased due to increasing force levels upon submersion in liquids (e.g., water).

FIG. 4A is a plot of maximum deflection versus fin width at fixed height and spacing. In this example scenario, the fin spacing S=30 nanometers and the fin height H=200 nanometers. The contact angle θ is about 45 degrees, which presumes each fin leans toward the other fin an equal amount. The dashed line indicates the maximum fin deflection that can occur before fin collapse will occur (fins begin to touch) and the solid line represents the fin deflection as a function of the fin width W. As further illustrated, under these specific conditions, the fins will collapse if the fin width W is less than 16 nanometers. FIG. 4B is a plot of maximum deflection versus fin spacing at fixed height and width. In this example scenario, the fin width W=11 nanometers and the fin height H=200 nanometers. The dashed line indicates the maximum fin deflection that can occur before fin collapse will occur and the solid line represents the fin deflection as a function of the fin spacing S. As illustrated, under these specific conditions, the fins will collapse if the fin spacing S is less than 55 nanometers. FIG. 4C is a plot of maximum deflection versus fin height at fixed width and spacing. In this example scenario, the fin width W=11 nanometers and the fin spacing S=30 nanometers. The dashed line indicates the maximum fin deflection that can occur before fin collapse will occur and the solid line represents the fin deflection as a function of the fin height H. As illustrated, under these specific conditions, the fins will collapse if the fin height H is greater than about 155 nanometers. These example scenarios are not intended to limit the present disclosure; rather, any number of fin geometries can benefit from having a non-straight fin morphology as provided herein, as will be appreciated in light of this disclosure.

For instance, in some example embodiments, the active fin height is between 20 nanometers and 75 nanometers. In another embodiment, the active fin height is between 30 nanometers and 50 nanometers. In yet another embodiment, the active fin height is between 30 nanometers and 40 nanometers. The active fin height is equal to the height of the upper part of the fin having the gate dielectric thereon, and the sub-fin height is equal to the height covered by the initial STI layers on top of the substrate. As will be appreciated, the initial STI can be recessed to expose the channel portion of the fins, so that subsequent MOS processing can be carried out (e.g., including formation of gate, source, and drain regions, and the associated contact structures). As shown in FIGS. 1A-1E, the total fin height=active fin height+sub-fin height. In one embodiment, the height of the sub-fin portion (which is sometimes referred to as a pedestal) is between 150 nanometers and 300 nanometers. In another embodiment, the height of the sub-fin portion is between about 150 nanometers and 250 nanometers. In another embodiment, the height of the sub-fin portion is between about 150 nanometers and 200 nanometers. In yet another embodiment, the height of the sub-fin portion is between about 200 nanometers and 250 nanometers. In yet another embodiment, the height of the sub-fin portion is between about 200 nanometers and 300 nanometers. Numerous such sub-fin/active fin configurations can be used. In addition, in some embodiments, the fins include a hardmask of either a single layer or multiple composition layers, such as but not limited to silicon nitride (SiN), polycrystalline silicon, and silicon dioxide (SiO2). In such cases, the problems associated with adhesion forces and/or cohesive forces may be exacerbated, thus leading to fin collapse. The various fin morphologies provided herein can be used to help mitigate such fin collapse, by reducing contact area between collapsed fins.

FIG. 5A illustrates a Scanning Electron Microscopy (SEM) top down image of a fin-based integrated circuit structure with some fins shown in a permanent collapsed state. As shown, the collapsed fins may appear as single lines where the uppermost portion of neighboring fins are contacting each other, while the non-collapsed fins appear as spaced apart double lines. FIG. 5B illustrates a SEM image of a fin-based integrated circuit structure according to one embodiment of the present disclosure where there is no fin collapse. As shown, all of the fins are in a non-collapsed state, and thus they all appear as double lines in the SEM image where a space remains between neighboring fins. The fins are straight in these example images, but are provided to further demonstrate fin collapse in real life.

Fin Morphology

As will be appreciated in light of this disclosure, a standard post-pattern (e.g., STR etch) rinse containing polar liquids, such as aqueous solutions (like sulfuric acid and/or hydrofluoric acid rinses), may cause or otherwise contribute to fin collapse. Accordingly, the present disclosure provides a plurality of different fin morphologies which may be used alone, or in combination, to reduce the adhesion and/or cohesive forces between adjacent fins, to thus mitigate fin collapse by allowing collapsed fins to return to their up-right position after drying. When the fractional contact length between collapsed fins is reduced, the adhesion force decreases roughly in proportion to the reduced fraction that is in contact. Numerous morphologies can provide this benefit.

Figure 6A:
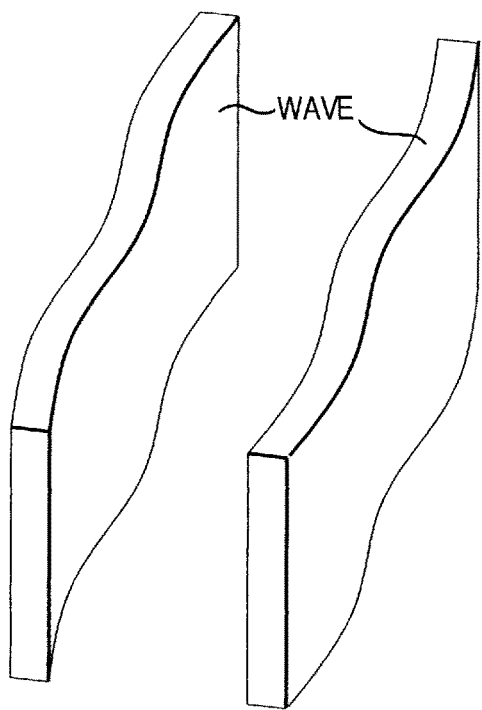
Figure 6B:
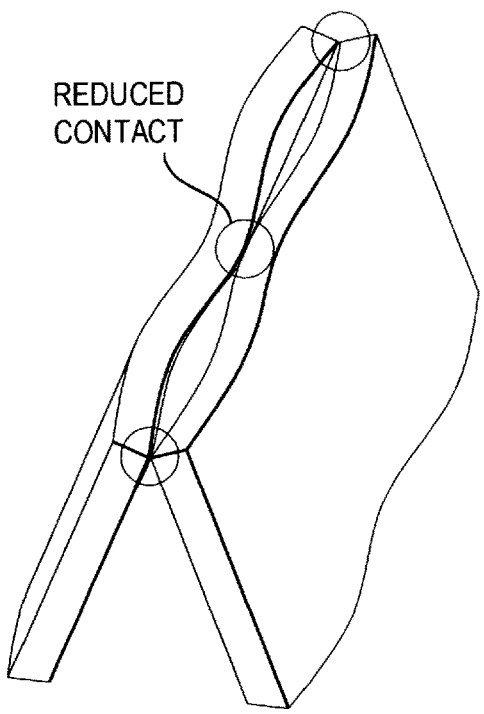

FIGS. 6A and 6B illustrate perspective views of example fins patterned to mitigate fin collapse by virtue of reduced inter-fin contact, in accordance with an embodiment of the present disclosure, wherein FIG. 6A shows the fins in an uncollapsed state and FIG. 6B shows the fins in a temporary collapsed state. As can be seen in this example case, the fins are shaped to have a sine-wave like morphology, wherein the fin undulates between peaks and troughs. As can be further seen in this example case, the fins are configured such that the corresponding wave patterns of neighboring fins are out of phase by approximately 180 degrees (within a suitable tolerance, such as +/−25 degrees, or otherwise, so long as collapsed fins are not in phase and don't provide a continuous line of inter-fin contact that is longer than 35% of the overall fin length). Thus, the troughs of the left fin touch the peaks of the right fin, thereby providing the reduced contact as shown in FIG. 6B. The peak-to-peak distance of the wave pattern can vary from one embodiment to the next, but in some cases is in the range of 1 nm to 10 nm, or 1 nm to 5 nm, or 1 nm to 2 nm. Likewise, the period (length of one complete wave) of the wave pattern can vary from one embodiment to the next, but in some cases is in the range of 10 nm to 100 nm, or 10 nm to 50 nm, or 10 nm to 20 nm. The wave pattern can be provided, for example, using any number of patterning methods such as, for example, a backbone and spacer patterning scheme, or extreme ultraviolet lithography (EUV) patterning. In a more general sense, any number of masking and etch schemes can be used to create a wavy trench, such as patterning a mask with the desired undulating pattern and then directional etching a trench using the mask to define the fin shape, followed by epitaxial deposition of the desired fin material into the undulating trench. In any such cases, the fins can be patterned with an undulating shape and out of phase to minimize the contact area to 35% or less of the fin length, according to some embodiments. In still other embodiments, the contact area between collapsed fins is 25% or less of the fin length. In still other embodiments, the contact area between collapsed fins is 20% or less of the fin length. In still other embodiments, the contact area between collapsed fins is 15% or less of the fin length. In still other embodiments, the contact area between collapsed fins is 10% or less of the fin length. In still other embodiments, the contact area between collapsed fins is 5% or less of the fin length. Other wave shapes can be used as well, such as a triangle wave (FIG. 8B) or a ramp wave (FIGS. 9A-9B). Note that perfect wave symmetry is not required, irregular wave or undulating patterns can equally provide a substantially reduced contact area between collapsed fins, as will be appreciated. Further note that only one of the two collapsed fins needs to have the undulating morphology (the other fin can be straight), which will still reduce the inter-fin contact between collapsed fins and thus mitigate fin collapse as variously provided herein.

Figure 7A:
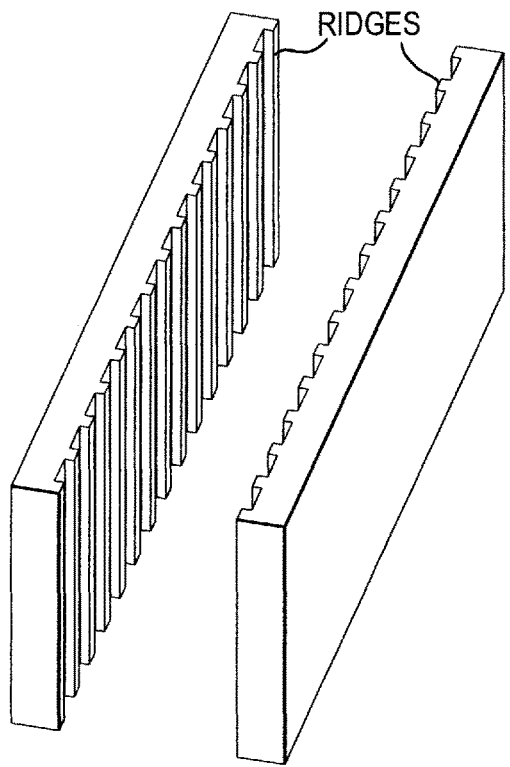
Figure 7B:
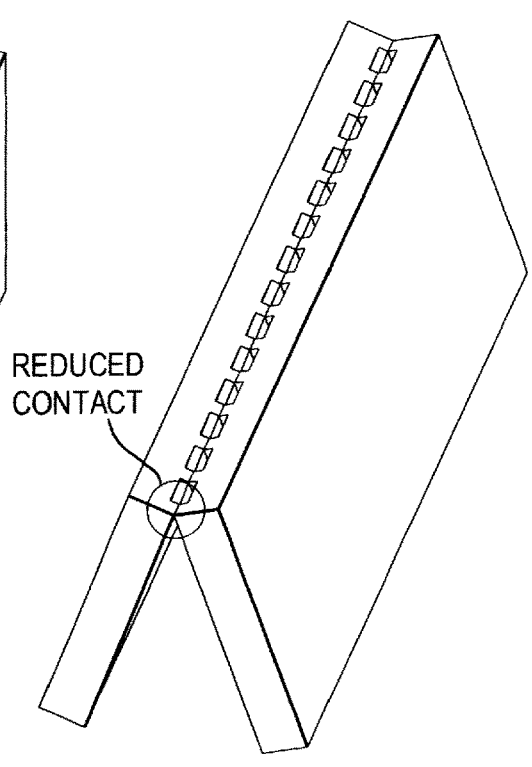
Figure 11A:
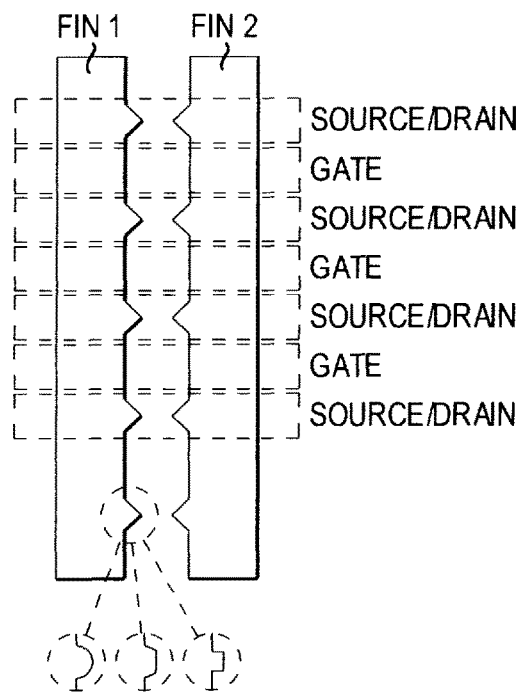
Figure 11B:
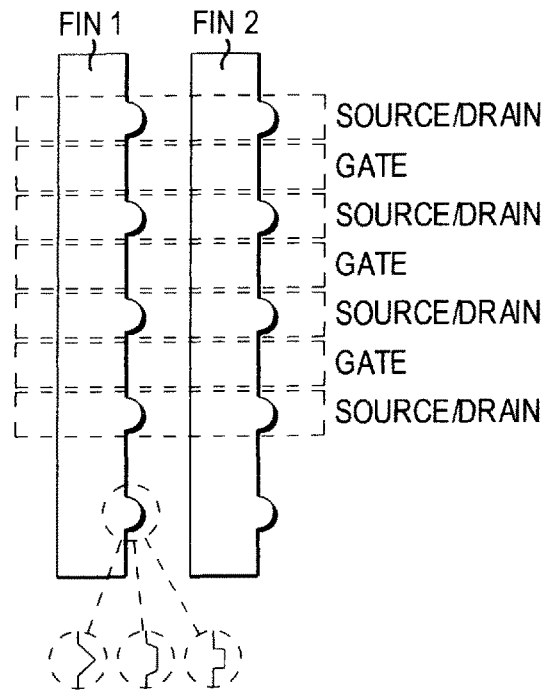

FIGS. 7A and 7B illustrate perspective views of example fins patterned to mitigate fin collapse by virtue of reduced inter-fin contact, in accordance with another embodiment of the present disclosure, wherein FIG. 7A shows the fins in an uncollapsed state and FIG. 7B shows the fins in a temporary collapsed state. As can be seen in this example case, the fins are configured with a plurality of ridges or nodules, on at least one side of the fin. As can be further seen, the fins are configured such that the corresponding ridges/nodules of neighboring fins are in phase or otherwise overlap. Thus, the ridges/nodules of the left fin touch the ridges/nodules of the right fin, thereby providing the reduced contact as shown in the example embodiment FIG. 7B. The ridges may travel the entire height of the fin so as to provide structural support as well, or alternatively, may be provisioned only near the top of the fin (nodules). The ridge/nodule pattern can be provided, for example, using any number of patterning methods such as, for example, a backbone and spacer scheme, or EUV patterning. In a more general sense, any number of masking and etch schemes can be used to create the ridges/nodules, such as patterning a mask with the desired undulating pattern and then directional etching a trench using the mask to define the fin shape, followed by epitaxial deposition of the desired fin material into the undulating trench. In any such cases, the fins can be patterned with one or more ridges/nodules to minimize the contact area to 35% or less of the fin length, according to some embodiments. The previous relevant discussion with respect to other example reduced contact area percentages provided with reference to FIGS. 6A-B is equally applicable here. The ridges/nodules of this example embodiment are rectangular or square in nature. Other ridge/nodule shapes can be used as well, such as triangle ridges/nodules or trapezoidal ridges/nodules or rounded ridges/nodules (FIGS. 11A-11B). Note that perfect alignment between ridges/nodules is not required, as long as there is some overlap of ridges/nodules, with the result being a substantially reduced contact area between collapsed fins, according to some embodiments. Further note that, in other embodiments, only one of the two collapsed fins has the ridge/nodule morphology (one fin is flat and straight, like in FIG. 11B), which will also have the effect of reducing the inter-fin contact between collapsed fins, as will be appreciated. The size of the ridges/nodules can vary from one embodiment to the next, but in some cases the ridges/nodules can protrude from the flat wall of the fin by a distance of 1 nm to 10 nm, or 1 nm to 5 nm, or 1 nm to 2 nm. Likewise, the length of one complete ridge/nodule running in the fin length direction can vary from one embodiment to the next, but in some cases is in the range of 1 nm to 10 nm, or 1 nm to 5 nm, or 1 nm to 2 nm. Another configuration point that can vary from one embodiment to the next, particularly with respect to fin length, is the number of ridges/nodules provided. In some embodiments, a 2×2 nm ridge/nodule is provided every 6 nm to 60 nm of fin length (which would cause contact of about 3% to 33% of fin length between neighboring collapsed fins), or every 10 nm to 50 nm of fin length (which would cause contact of about 4% to 20% of fin length between neighboring collapsed fins), or every 15 nm to 25 nm of fin length (which would cause contact of about 8% to 13% of fin length between neighboring collapsed fins).

Figure 8A:
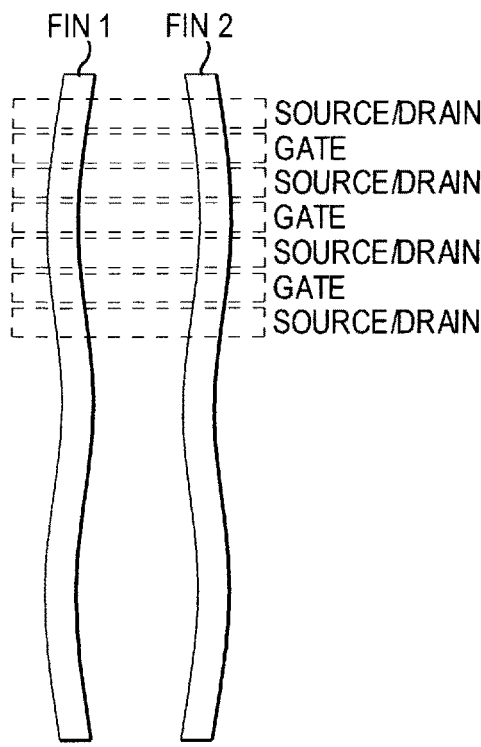
FIGS. 8A through 11B each illustrates a top down cross-sectional view of example fins patterned to mitigate fin collapse by virtue of reduced inter-fin contact, in accordance with various embodiment of the present disclosure.

FIGS. 8A through 11B each illustrates a top down cross-sectional view of example fins patterned to mitigate fin collapse by virtue of reduced inter-fin contact, in accordance with various embodiment of the present disclosure. FIG. 8A shows neighboring fins having a sinusoidal wave pattern. As can be seen, the gate/channel region and source/drain regions are provided on the fin as normally done, such that the gate/channel region is between a source region and a drain region. Standard gate-first and gate-last (or so-called replacement metal gate, RMG) processes may be used. The gate stack generally includes a gate dielectric (e.g., silicon dioxide and/or hafnium oxide), a gate electrode (e.g., tungsten and/or tantalum nitride), and gate spacers (e.g., silicon dioxide or silicon nitride). The source/drain regions may be provisioned through ion implantation at appropriate fin locations (where source/drain semiconductor material is native to the fins, such as silicon fins with silicon source/drain regions) or via an etch and epitaxial deposition process (where source/drain semiconductor material is distinct from the fins, such as silicon fins with silicon germanium source/drain regions). As will be further appreciated, the dimensions of the gate/channel and source/drain regions can vary from one embodiment to the next. Numerous variations and configurations will be apparent. For instance, in some embodiments, neighboring gate/channel regions can be provided on opposing peaks and troughs (i.e., the peak of one fin and the opposing trough of the neighboring fin), to ensure the gates of neighboring fins are sufficiently far away from one another. In another example embodiment, only every other fin has the sine wave morphology, and each neighboring fin is straight. In such a case only the troughs (or peaks, depending morphology of neighboring fins) of one fin will contact the straight side wall of the neighboring fin. In another example embodiment, only every other fin has the sine wave morphology, and each neighboring fin is straight but is configured with a ridge or nodule. In some such cases, the troughs (or peaks, depending morphology of neighboring fins) of one fin can be aligned with the ridge/nodule of the neighboring fin to further reduce inter-fin contact.

Figure 8B:
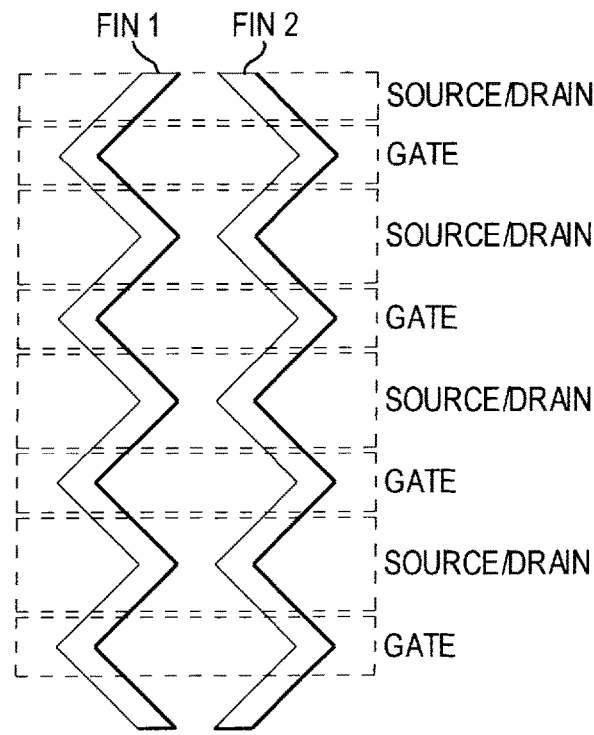
Figure 9A:
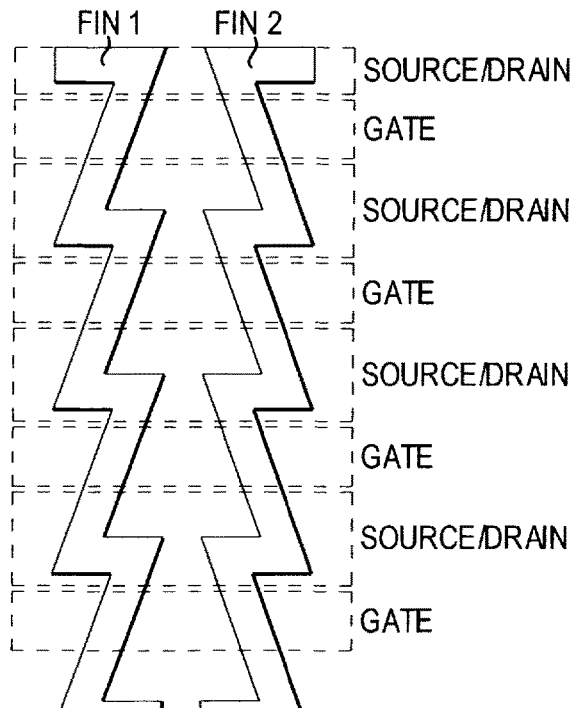
Figure 9B:
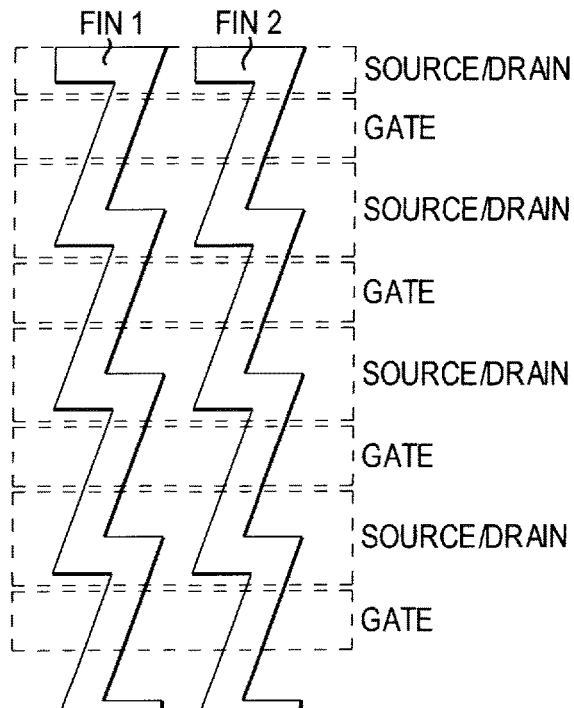

The embodiment shown in FIG. 8B is similar to the embodiment shown in FIG. 8A, except that the neighboring fins have a triangle wave pattern. The previous discussion with respect to FIG. 8A is equally applicable here. The embodiment shown in FIG. 9A is similar to the embodiment shown in FIG. 8A, except that the neighboring fins have a ramp or step wave pattern. The previous discussion with respect to FIG. 8A is equally applicable here. Note that the ramp portion of the wave (the diagonal portion between the horizontal portions) can be used for the gate/channel regions, in some embodiments. In such cases, the horizontal portions can be used for the source/drain regions. The embodiment shown in FIG. 9B is similar to the embodiment shown in FIG. 9A, except that the orientation of the right fin is reversed. As will be appreciated, however, a similar benefit of reduced inter-fin contact is provided during a collapse condition. The previous discussion with respect to FIG. 9A is equally applicable here.

Figure 10A:
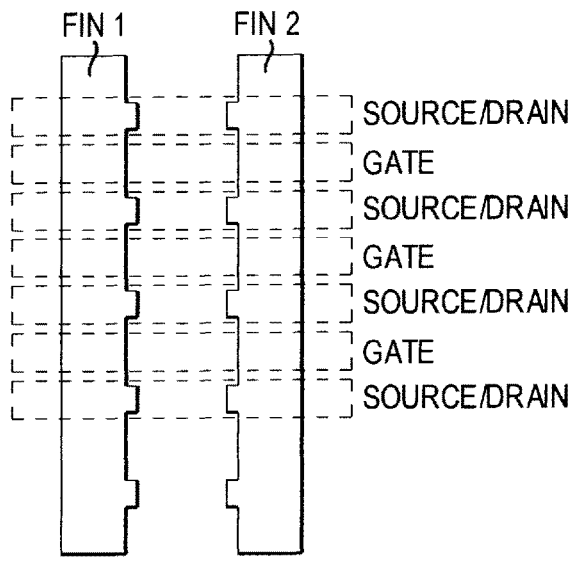
Figure 10B:
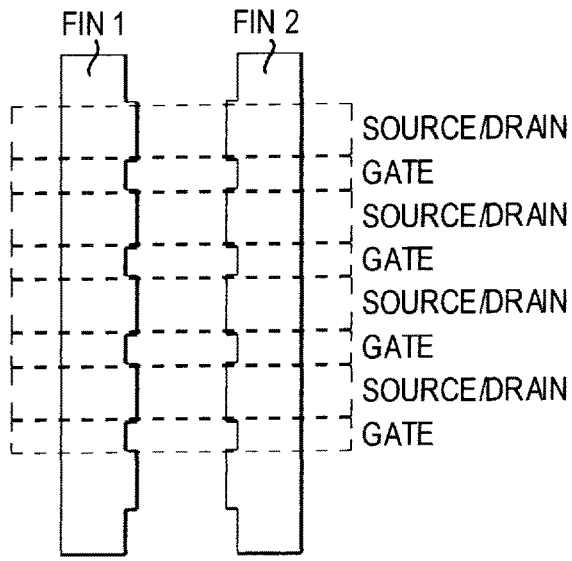

FIG. 10A shows neighboring fins having an opposing ridge/nodule pattern, according to an embodiment. As can be seen, the gate/channel regions are provided over the fin areas between the ridges/nodules, and the source/drain regions are provided over the fin areas including the ridges/nodules. Since the gate pitch is known in advance, it is possible to fabricate source/drain regions wider than gate/channel regions, as shown. Note that a ridge travels all or a relatively large portion of the height of the fin and provides structural support to the fin. This structural support further helps to inhibit fin collapse, or otherwise encourage return of a collapsed fin to its uncollapsed state. A nodule, on the other hand, only travels a relatively small portion of the fin height (e.g., the uppermost 2 nm to 10 nm of the fin height). As can be further seen, the length of the ridges makes up about 35% or less of the total fin length. Further note that only the opposing sides of the fins are shown as having ridges/nodules. Other embodiments may have the ridges/nodules on both sides of each fin, while other embodiments may have the ridges/nodules only on non-opposing sides of the fin, such that the ridges/nodules of one fin contact the flat side of its neighboring fin (like in FIG. 11B, for instance). The embodiment shown in FIG. 10B is similar to the embodiment shown in FIG. 10A, except that the ridges are longer and therefore allow for a greater degree of inter-fin contact for that particular portion of the fin. Simulation shows, however, that adhesive forces that cause permanent fin collapse decrease linearly with decreased inter-fin contact length. As will be appreciated in light of this disclosure, the ridges/nodules effectively decrease contact length to something less than 100% of nearest neighbor fin length, such as 66% to 35% for some portions of a long fin (e.g., along a 500 nm portion of fin that is 5000 nm to 10000 nm long), or 35% or less over the entire length, or 20% or less over the entire length. Note the linear relationship between the percentage of inter-fin contact and adhesive force exhibited during fin collapse. For instance, an inter-fin contact distance of about 20% or less results in a reduction in adhesive force of about 80% or more.

The embodiment shown in FIG. 11A is similar to the embodiment shown in FIG. 10A, except that the ridges/nodules have a triangle-shaped horizontal cross section as shown, rather than a square/rectangle-shaped horizontal cross section. As will be appreciated, such a ridge/nodule profile may further help reduce inter-fin contact distance. Further note the other example ridge/nodule profiles shown, including semi-circle, trapezoid, and small square (e.g., 2×2 nm or smaller) shaped profiles. The previous discussion with respect to FIG. 10A is equally applicable here, including the discussion regarding having ridges/nodules on both sides of each fin or on non-opposing sides of each fin. For example, the embodiment shown in FIG. 11B includes ridges/nodules on non-opposing sides of neighboring fins. As can be further seen, the ridges/nodules can have any number of shapes, such as semi-circle, triangle, trapezoid, and small square (e.g., 2×2 nm or smaller) shaped profiles.

Transistor Device Materials and Construction

The fins may be formed on or from the substrate by a variety of conventional approaches as the disclosure is not limited in this respect. In one embodiment, the plurality of fins is native to the substrate in that each fin is a seamless extension of the substrate. In another embodiment, the plurality of fins are replacement fins formed on the substrate in that there is a seam located at an intermediate height of the fin and the replacement fins may be formed by standard techniques, such as those described in U.S. Patent Application Publication 2014/0027860 titled "Self-Aligned 3-D Epitaxial Structures for MOS Device Fabrication" and assigned to Intel Corporation. In such cases, the channel material can be provided after so-called placeholder fins are formed and then recessed or otherwise removed. In more detail, the substrate can be patterned and etched into placeholder fins formed from the substrate material. Those fins are then encased in an insulator or other suitable material. The place holder fins can then selectively be recessed or otherwise removed and replaced with a desired channel material. In some such cases, the replacement channel material can be provided in the context of multilayer stacks that include alternating layers of desired channel material and sacrificial/inactive material, such as that described in the previously noted U.S. Pat. No. 9,343,559.

In any case, once the fins having one or more morphologies as provided herein, subsequent processing to form a completed transistor device, which may include for instance, source and drain regions, a final gate stack, and metal contacts, can be carried out for instance as normally done or using any custom processing as desired. Numerous fin-based configurations will be apparent in light of this disclosure, and the present disclosure is not intended to be limited to any particular one. Following formation of the discrete channel regions such as in the variously example embodiments depicted in FIGS. 1A-1D, gate dielectric and gate electrode processing may be performed, and source and drain contacts may be added, in accordance with some example embodiments. Such post-channel processing can be carried out as normally done. Note that gate formation may be carried out using a gate-last or so-called RMG (remove metal gate) process, where dummy gate materials are first provided over the channel and then later removed and replaced with the desired gate materials after the source/drain processing is complete. Alternatively, the gate formation may be carried out using a gate-first process.

In some example embodiments, the gate dielectric can be, for example, any suitable oxide such as $SiO_2$ or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In general, the thickness of the gate dielectric should be sufficient to electrically isolate the gate electrode from the source and drain contacts. The gate electrode material can be, for example, polysilicon, silicon nitride, silicon carbide, or one or more metal layers (e.g., tungsten, titanium nitride, tantalum, tantalum nitride) although other suitable gate electrode materials and structures can be used as well. The formed gate electrode may then be covered with a mask to protect it during subsequent processing. The gate dielectric, gate electrode and any optional mask materials can be generally referred to as a gate stack or gate structure.

Once the gate stack is fabricated (whether the actual gate or a dummy gate, depending on the gate forming process used), the source/drain regions can be processed. This processing may include, for example, exposing the source/drain regions by etching or otherwise removing the additional insulator material from around the fin or replacement fins, so that source drain regions can be doped (ion implantation) or etched-and-replaced with a desired material(s) and structure. Then, source/drain contacts can be provisioned, which may be accomplished using a silicide or germanide process, for example. Typical source/drain region materials include silicon, germanium, SiGe, or III-V materials, and are normally doped either n-type (e.g., phosphorous dopant) or p-type (e.g., boron dopant) to provide NMOS or PMOS transistors, respectively. Typical source drain contact materials include, for example, tungsten, titanium, silver, gold, aluminum, and alloys thereof.

As will be appreciated, the transistor forming methodology can be carried out using any suitable standard semiconductor processes, including lithography, chemical vapor deposition (CVD), atomic layer deposition (ALD), spin-on deposition (SOD), physical vapor deposition (PVD), wet and dry etching (e.g., isotropic and/or anisotropic), depending on the materials used and desired profiles. Alternate deposition techniques may be used as well, for instance, various material layers may be thermally grown. As will be further appreciated in light of this disclosure, any number of suitable materials, layer geometries, and formation processes can be implemented, so as to provide a fin-based device or structure as described herein.

Figure 12A:
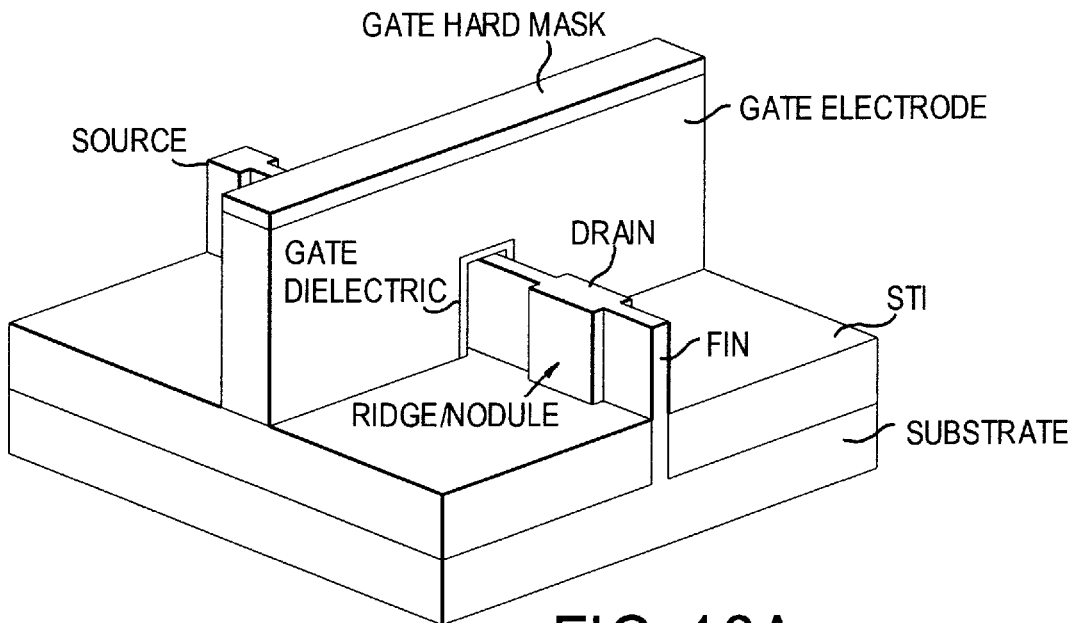
FIGS. 12A and 12B each illustrates a perspective view of an integrated circuit device that is configured in accordance with an embodiment of the present disclosure.
Figure 12B:
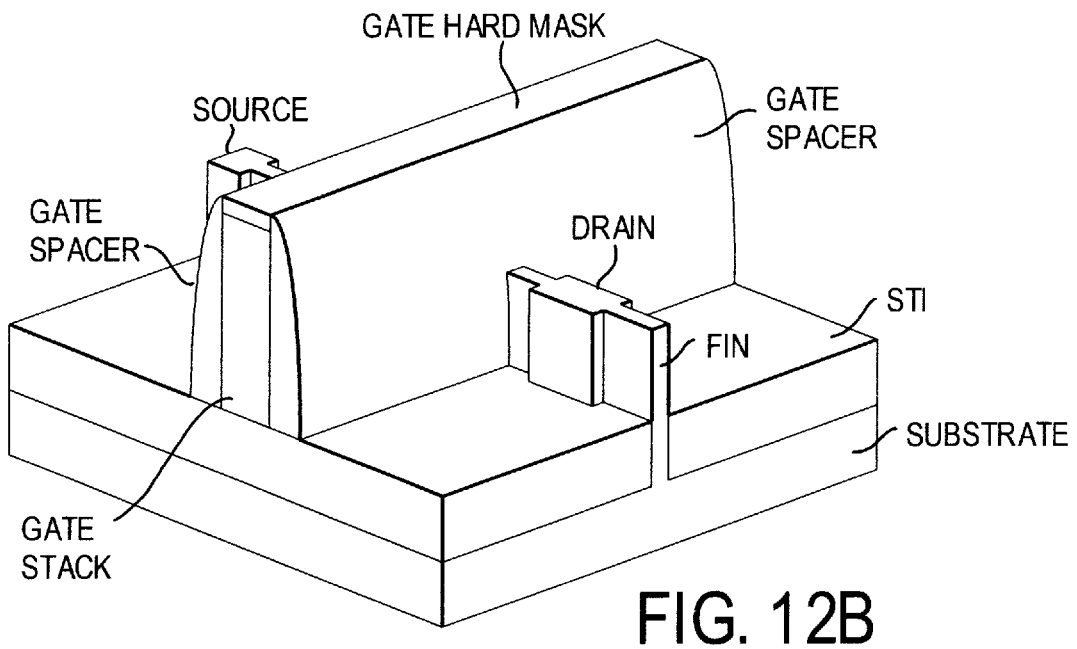

FIGS. 12A and 12B each illustrates a perspective view of an integrated circuit device that is configured in accordance with an embodiment of the present disclosure. The example non-planar configuration shown in FIG. 12A includes a substrate having a semiconductor body or fin extending from the substrate through a shallow trench isolation (STI) layer. The portion of the fin above the STI layer effectively forms the channel of the transistor device. Recall that the channel portion of the fin may be native to the substrate or an alternative channel material. As can be seen, the fin morphology is configured with ridges in the source/drain regions, which are used to mitigate fin collapse during wet processing (prior to source/drain formation). Other embodiments may have an undulating morphology (e.g., sine wave, triangle wave, or ramp wave), or alternate shaped ridges/nodules (e.g., semicircle, trapezoidal, triangle), as previously explained. As can be further seen in FIG. 12A, the gate/channel is provided between the ridges in the narrower part of the fin, in this example case. A gate dielectric material is provided in this channel region between the fin and a gate electrode, and a hard mask is formed on top of the gate electrode. Note that the gate electrode is formed over three surfaces of the fin to form three gates (hence, a tri-gate device). FIG. 12B illustrates the resulting structure after deposition of insulating spacer material (e.g., silicon dioxide or silicon nitride) and subsequent etch that leaves a coating of the insulator material on the vertical surfaces of the gate stack (which includes the gate dielectric, gate electrode, and gate hard mask, in this example case), so as to provide the gate spacers.

Figure 13A:
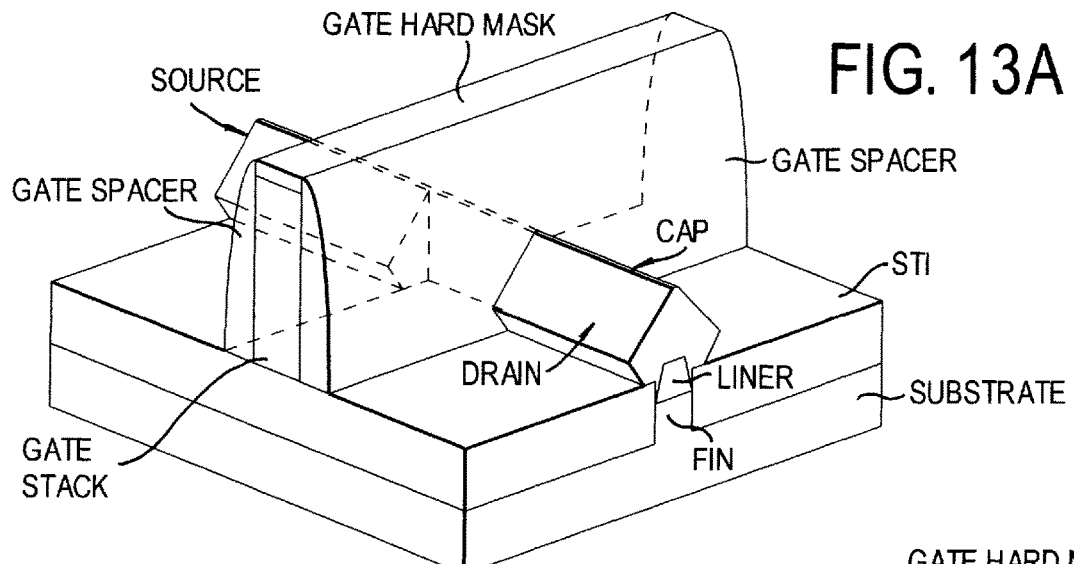
FIGS. 13A through 13C each illustrates a perspective view of an integrated circuit device that is configured in accordance with other embodiments of the present disclosure.
Figure 13B:
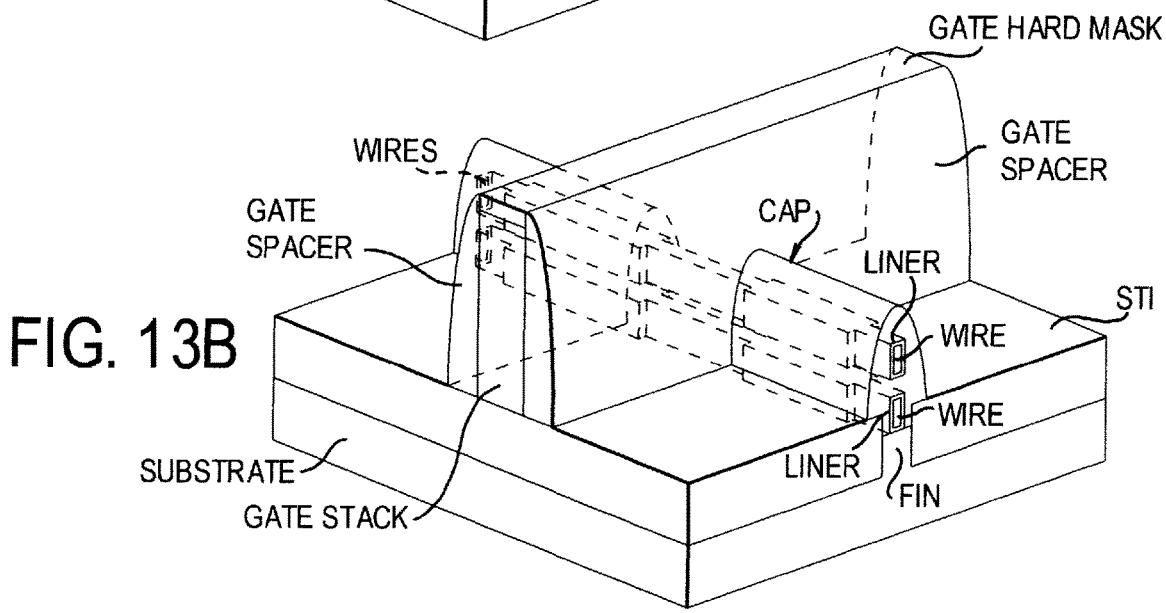
Figure 13C:
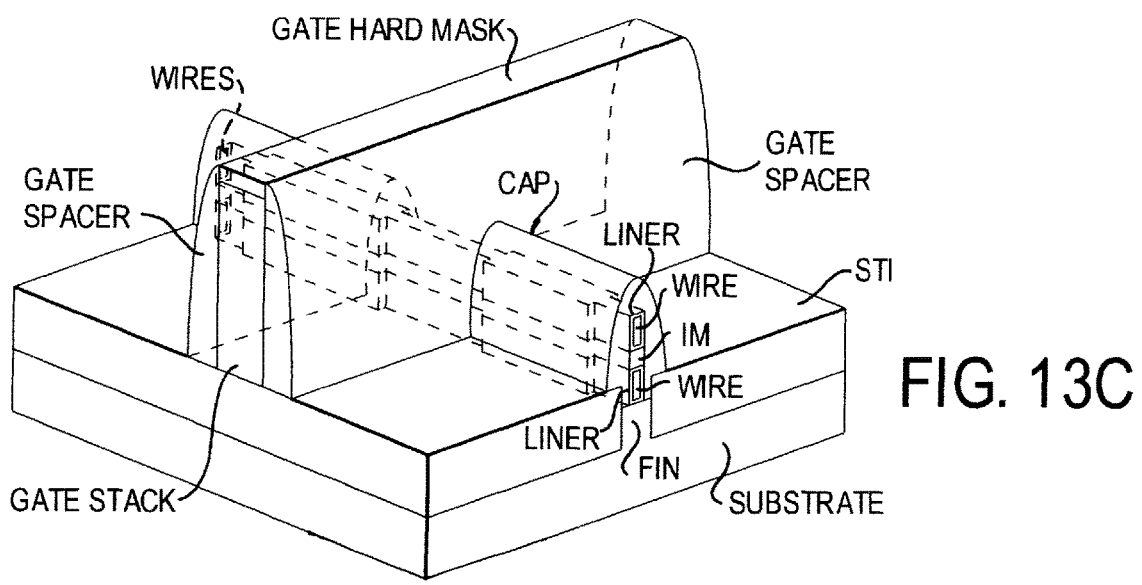

FIGS. 13A through 13C each illustrates a perspective view of an integrated circuit device that is configured in accordance with other embodiments of the present disclosure. As will be appreciated, the fin can have an undulating or ridge/nodule based morphology as variously provided. In this particular embodiment, the fin includes ridges in the source/drain regions, much like the embodiment shown in FIGS. 12A-B. The source/drain regions can be formed in the originally provided fin structure in some embodiments. Alternatively, in other embodiments, the source/drain regions are formed by an etch-and-replace process. For instance, FIG. 13A illustrates an example transistor structure after growth of an epitaxial source/drain liner and cap configuration in the source/drain regions. The epitaxial liner may be, for example, a thin p-type silicon-containing (e.g., silicon or SiGe having 70 atomic % silicon) liner, or a pure germanium (e.g., a separate layer of germanium, or a non-detectable layer that is integrated or otherwise included in the composition of the caps). The epitaxial cap can be, for example, p-type and comprise primarily germanium but may contain less than 20 atomic % tin, according to some embodiments. Other embodiments may have a single layer source/drain configuration rather than a bi-layer structure, or some other desired configuration. Numerous other source/drain configurations and material systems can be used, as will be appreciated. As will further be appreciated, note that an alternative to the tri-gate configuration as shown is a double-gate architecture, which would include an isolation layer on top of the fin, such that the gate resides predominately on the two opposing sides of the fin (again, above the STI region). Further note that the example shapes of the epitaxial liner and cap making up the source/drain regions in this example case are not intended to limit the present disclosure to such shapes; rather, other source/drain shapes will be apparent in light of this disclosure (e.g., round, square or rectangular source/drain regions may be implemented, whether they be raised, flush, or recessed relative to the top of the channel layer).

FIG. 13B shows a perspective view of a nanowire transistor structure formed in accordance with one embodiment of the present disclosure. As will be appreciated, the fin can have an undulating or ridge/nodule based morphology as variously provided. In this particular embodiment, the fin includes ridges in the source/drain regions, such that the wires are narrower in the channel region than in the source/drain regions. A nanowire transistor (sometimes referred to as gate-all-around FET) is configured similarly to a fin-based transistor, but instead of a relatively tall fin, a relatively shorter fin (generally called a nanowire or nanoribbon, depending on how short) is used and the gate material generally surrounds the channel region on all sides. Depending on the particular design, some nanowire transistors have, for instance, four effective gates. This example embodiment includes two nanowires (generally designated as wire, and intended to include ribbons and nanowires, depending on aspect ratio), although other embodiments can have any number of wires. The nanowires can be implemented, for example, with p-type silicon or germanium or SiGe or III-V nanowires. As can be seen, one nanowire is formed or otherwise provided on a pedestal of the substrate and the other nanowire effectively floats in the source/drain material, which in this example embodiment is a bi-layer construction comprising liner and cap. Single layer constructions may also be used, or any other desired construction. Other embodiments may have a recess in the substrate in which the nanowire is formed (rather than on a pedestal). Just as with the fin configuration in FIG. 12A, note that the nanowires can be replaced in the source/drain regions with a single layer or bi-layer or multi-layer construction of source/drain material (e.g., relatively thin silicon or germanium or SiGe liner and relatively thick high concentration germanium cap). Alternatively, a multi-layer construction can be provided around the originally formed nanowire as shown (where the liner is provided around the nanowire, and the cap is then provided around the liner).

FIG. 13C also illustrates another example nanowire configuration having multiple nanowires, but in this example case, inactive material (IM) is not removed from between the individual nanowires during the nanowire forming process, which can be carried out using various standard techniques. Thus, one nanowire is provided on a pedestal (or recess) of substrate and the other nanowire effectively sits on top of the inactive material. Note the nanowires are active through the channel, but the inactive material is not. As can be seen, the bi-layer source/drain construction of liner and cap is provided around all other exposed surfaces of the nanowires. The previous relevant discussion with respect to FIG. 13B is equally applicable here. Again, other embodiments may include single layer construction or some other multi-layer construction.

Example System

Figure 14:
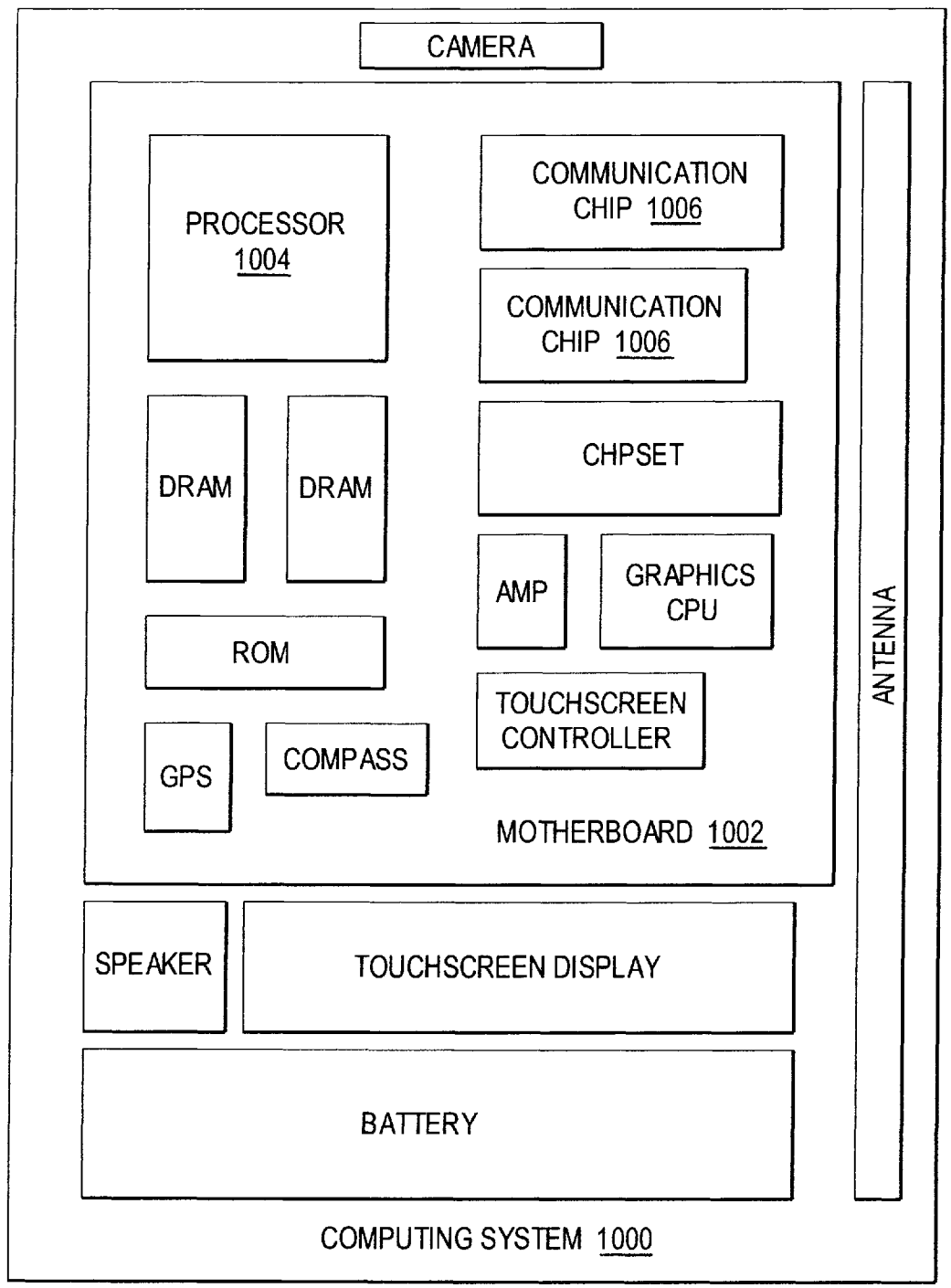
FIG. 14 illustrates a computing system implemented with one or more integrated circuit structures configured in accordance with an embodiment of the present disclosure.

FIG. 14 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with fin-based transistors having fin morphology configured to mitigate fin collapse, as variously explained herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present disclosure, the integrated circuit die of the processor 1004 includes one or more fin-based transistors having fin morphology configured to mitigate fin collapse, as variously explained herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more fin-based transistors having fin morphology configured to mitigate fin collapse, as variously explained herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that employs fin-based transistors having fin morphology configured to mitigate fin collapse, as variously explained herein. As will be appreciated in light of this disclosure, various embodiments of the present disclosure can be used to improve performance on products fabricated at any process node (e.g., in the micron range, or sub-micron and beyond) by allowing for the use of fin-based transistors having high aspect ratio fins configured to mitigate fin collapse, as variously explained herein.

FURTHER EXAMPLE EMBODIMENTS

The following examples pertain to further embodiments, from which numerous permutations and configurations will be apparent.

Example 1 is an integrated circuit device, including: a substrate having a fin extending therefrom, the fin having a morphology configured to reduce inter-fin contact during fin collapse; and a gate dielectric over a channel region of the fin; and source/drain regions adjacent the channel region, such that the channel region is between the source region and the drain region.

Example 2 is the device of Example 1, wherein the fin morphology includes an undulating wave pattern to reduce inter-fin contact during fin collapse.

Example 3 is the device of Example 2, wherein the undulating wave pattern is a sine wave.

Example 4 is the device of Example 2, wherein the undulating wave pattern is a triangle wave.

Example 5 is the device of Example 2, wherein the undulating wave pattern is a ramp wave.

Example 6 is the device of any of Examples 2 through 5, wherein the fin morphology further includes at least one of a ridge and nodule disposed on a sidewall of the fin to reduce inter-fin contact during fin collapse. Note that a ridge runs the entire height of the fin, while a nodule runs only part of the height starting from the top of the fin.

Example 7 is the device of Example 6, wherein the at least one of a ridge and nodule is located in at least one of the source region and the drain region.

Example 8 is the device of Example 1, wherein the fin morphology includes at least one of a ridge and nodule disposed on a sidewall of the fin to reduce inter-fin contact during fin collapse. Note that a ridge runs the entire height of the fin, while a nodule runs only part of the height starting from the top of the fin.

Example 9 is the device of Example 8, wherein the at least one of a ridge and nodule is located in at least one of the source region and the drain region.

Example 10 is the device of Example 8, wherein the at least one of a ridge and nodule has a square or rectangular shape.

Example 11 is the device of Example 8, wherein the at least one of a ridge and nodule has a semicircle shape.

Example 12 is the device of Example 8, wherein the at least one of a ridge and nodule has a triangle shape.

Example 13 is the device of Example 8, wherein the at least one of a ridge and nodule has a trapezoidal shape.

Example 14 is the device of any of the preceding Examples, wherein the fin is native to the substrate. For instance, a silicon fin etched from a silicon substrate to have the morphology.

Example 15 is the device of any of Examples 1 through 13, wherein the fin comprises semiconductor material distinct from semiconductor material of the substrate. For instance, a silicon germanium fin provisioned on a silicon substrate via an trench-based deposition or so-called aspect ratio trapping process, to have the morphology.

Example 16 is the device of any of the preceding Examples, wherein at least one of the channel region, the source region, and the drain region comprises at least one nanowire.

Example 17 includes an integrated circuit device, including: a substrate having first and second fins extending therefrom, each of the first and second fins having a length, a width, and a height, and at least one of the first and second fin has a morphology configured to reduce inter-fin contact during fin collapse; a gate dielectric over a channel region of the first fin; and source/drain regions adjacent the channel region, such that the channel region is between the source region and the drain region; wherein during fin collapse, inter-fin contact distance between the first and second fins is 35% or less of the fin length. In still other Example cases, the inter-fin contact distance between the first and second fins is 20% or less of the fin length. Note that the inter-fin contact distance between the first and second fins can be higher (e.g., up to 66%) for a portion of the fin length for a relatively long fin. In such cases, the portion has a length that is, for example, 25% or less of the overall fin length. In a more general sense, the portion can have any length that allows the fin to recover from a collapsed state.

Example 18 is the device of Example 17, wherein the morphology of the at least one of the first and second fins includes an undulating wave pattern to reduce inter-fin contact during fin collapse.

Example 19 is the device of Example 18, wherein the morphology of one of the first and second fins is a straight fin.

Example 20 is the device of Example 18 or 19, wherein the morphology of the at least one of the first and second fins further includes at least one of a ridge and nodule disposed on a fin sidewall to reduce inter-fin contact during fin collapse.

Example 21 is the device of Example 20, wherein the at least one of a ridge and nodule is located in at least one of the source region and the drain region.

Example 22 is the device of Example 17, wherein the morphology of both the first and second fins includes an undulating wave pattern to reduce inter-fin contact during fin collapse, the undulating wave pattern of the first fin being out of phase with the undulating wave pattern of the second fin.

Example 23 is the device of Example 22, wherein the morphology of the first and second fins further includes at least one of a ridge and nodule disposed on a fin sidewall to reduce inter-fin contact during fin collapse.

Example 24 is the device of Example 23, wherein the at least one of a ridge and nodule is located in at least one of the source region and the drain region.

Example 25 is the device of Example 17, wherein the morphology of the at least one of the first and second fins further includes at least one of a ridge and nodule disposed on a fin sidewall to reduce inter-fin contact during fin collapse.

Example 26 is the device of Example 25, wherein the morphology of one of the first and second fins is a straight fin.

Example 27 is the device of Example 25 or 26, wherein the at least one of a ridge and nodule is located in at least one of the source region and the drain region.

Example 28 is the device of Example 17, wherein the morphology of both the first and second fins includes at least one of a ridge and nodule disposed on a fin sidewall to reduce inter-fin contact during fin collapse.

Example 29 is the device of Example 28, wherein the at least one of a ridge and nodule of each of the first and second fins is located in at least one of the source region and the drain region.

Example 30 is the device of Example 28 or 29, wherein the at least one of a ridge and nodule of the first fin is in an opposing relationship with the at least one of a ridge and nodule of the second fin, such that the opposing ridges/nodules contact each other during fin collapse.

Example 31 is the device of Example 28 or 29, wherein the at least one of a ridge and nodule of the first fin is in a non-opposing relationship with the at least one of a ridge and nodule of the second fin, such that the ridges/nodules of either fin contacts a straight side of a neighboring fin during fin collapse.

Example 32 is the device of any of Examples 28 through 31, wherein the channel region of first fin is located between a pair of ridges or nodules.

Example 33 is a method for making integrated circuit device. The method includes: providing a substrate having a fin extending therefrom, the fin having a morphology configured to reduce inter-fin contact during fin collapse; providing a gate dielectric over a channel region of the fin; and providing source/drain regions adjacent the channel region, such that the channel region is between the source region and the drain region.

Example 34 is the device of Example 33, wherein the fin morphology is provided by extreme ultraviolet lithography (EUV) patterning, and includes at least one of an undulating wave pattern, a ridge, and a nodule, to reduce inter-fin contact during fin collapse.

Example 35 is the device of Example 34, wherein the morphology includes the undulating wave pattern, and the undulating wave pattern is a sine wave, a triangle wave, or a ramp wave.

Example 36 is the device of Example 34 or 35, wherein the fin morphology includes at least one of the ridge and the nodule disposed on a sidewall of the fin to reduce inter-fin contact during fin collapse.

Example 37 is the device of Example 36, wherein the at least one of the ridge and the nodule is located in at least one of the source region and the drain region.

Example 38 is the device of Example 36 or 37, wherein the at least one of the ridge and the nodule has a square shape, a rectangular shape, a semicircle shape, a triangle shape, or a trapezoidal shape.

Example 39 is the device of any of Examples 33 through 38, wherein providing a substrate having a fin extending therefrom includes use of an aspect ratio trapping (ART) process to provide the channel region of the fin.

Example 40 is the device of any of Examples 33 through 39, wherein at least one of the channel region, the source region, and the drain region comprises at least one nanowire.

The foregoing description of example embodiments of the disclosure has been presented for the purposes of illustration and description. It is not intended to be exhaustive or to limit the disclosure to the precise forms disclosed. Many modifications and variations are possible in light of this disclosure. For instance, while the techniques are discussed primarily in the context of forming transistors such as FETs, other devices can be made as well such as diodes, variable capacitors, dynamic resistors, etc. It is intended that the scope of the disclosure be limited not by this detailed description, but rather by the claims appended hereto.

What is claimed is:

1. An integrated circuit device, comprising:
   a substrate having a fin extending therefrom, the fin comprising semiconductor material and having a morphology configured to reduce inter-fin contact during fin collapse,
   the morphology including an undulating wave pattern having peaks and troughs that are out of phase with peaks and troughs of an undulating wave pattern of an adjacent fin morphology, such that inter-fin contact between the fin and the adjacent fin during a fin collapse condition prior to formation of source and drain regions is limited by the peaks of the fin and the troughs of the adjacent fin;
   a gate dielectric on top and side walls of a first portion of the fin; and
   a source region on or in a second portion of the fin and adjacent the first portion, and a drain region on or in a third portion of the fin and adjacent the first portion, such that the first portion is between the source region and the drain region.

2. The device of claim 1 undulating wave pattern of the fin is approximately 180 degrees out of phase with the undulating wave pattern of the adjacent fin.

3. The device of claim 2 wherein the morphology of the fin further includes a first ridge or nodule of the semiconductor material laterally extending from a sidewall of the second portion of the fin, and a second ridge or nodule of the semiconductor material laterally extending from a sidewall of the third portion of the fin, such that the second and third portions both extend laterally in the same direction farther than the first portion extends laterally in that direction.

4. The device of claim 1 wherein the undulating wave pattern of the fin is a sine wave, a triangle wave, or a ramp wave, and the undulating wave pattern of the fin is 155 to 205 degrees out of phase with the undulating wave pattern of the adjacent fin, such that fin inter-fin contact between the fin and the adjacent fin during a fin collapse condition prior to formation of source and drain regions is 35% or less of the fin length.

5. The device of claim 1, wherein the morphology of the fin further includes a first ridge or nodule of the semiconductor material laterally extending from a sidewall of the second portion of the fin, and a second ridge or nodule of the semiconductor material laterally extending from a sidewall of the third portion of the fin, such that the second and third portions both extend laterally in the same direction farther than the first portion extends laterally in that direction.

6. The device of claim 5, wherein the semiconductor material is a first semiconductor material, and the source region and the drain region comprise a second semiconductor material that is compositionally distinct from the first semiconductor material in addition to any n-type dopant included in the source and drain regions, and the first and second ridges or nodules each has a square or rectangular shape, a semicircle shape, a triangle shape, or a trapezoidal shape.

7. The device of claim 1, wherein the semiconductor material of the fin is compositionally distinct from a semiconductor material of the substrate, and is also compositionally distinct from a semiconductor material of the source region and the drain region in addition to any n-type or n-type dopant included in the source and drain region, such that the source region is on the second portion of the fin and wider than the second portion of the fin, and the drain region is on the portion of the fin and wider than the third portion of the fin.

8. The device of claim 1, wherein at least one of the first portion, the source region, and the drain region comprises at least one nanowire.

9. An integrated circuit device, comprising:
   a substrate having first and second fins extending therefrom and adjacent to one another, each of the first and second fins comprising semiconductor material and having a length, a width, and a height, and the first and second fins each has a morphology configured to reduce inter-fin contact during fin collapse;
   wherein the morphology of the fin includes a first pattern of ridges or nodules of a sidewall of the first fin, and the morphology of the second fin includes a second pattern of ridges or nodules of a sidewall of the second fin, the first and second patterns being part of the first and second fins respectively and comprising the semiconductor material;
   wherein the first pattern is in phase with the second pattern, such that each of the ridges or nodules of the pattern aligns with a corresponding one of the ridges or nodules of the second pattern; and
   wherein during a fin collapse condition prior to formation of source and drain regions, inter-fin contact between the first and second fins is 35% or less of the fin length and is limited to the ridges or nodules for at least one of the first and second fins.

10. The device of claim 9 wherein the first patterning is facing the second pattern, such that inter-fin contact between the first and second fins during a fin collapse condition prior to formation of source and drain regions is limited to the ridges or nodules of both the first and second fins.

11. The device of claim 9, wherein the first pattern and the second pattern are each on the same side of the first and second fins, respectively, such that the first pattern is not facing the second pattern and inter-fin contact between the first and second fins during a fin collapse condition prior to formation of source and drain regions is limited to the ridges or nodules of one the first and second fins and a straight side of the other of the first and second fins.

12. The device of claim 9, wherein a ridge runs the entire height of the fin, and a nodule runs only part of the height starting from the top of the fin.

13. The device of claim 9, further comprising:
   a gate dielectric on top and side walls of a first portion of the first fin; and
   a source region on or in a second portion of the first fin and adjacent the first portion, and a drain region on or in a third portion of the fin and adjacent the first portion, such that the first portion is between the source region and the drain region.

14. The device of claim 13, wherein the source region is on the second portion of the first fin, and the drain region is on the third portion of the fin, and a first ridge of the first pattern is under at least a portion of the source region and a second ridge on the first pattern is under at least a portion of the drain region.

15. The device of claim 13, wherein the source region is in the second portion of the first fin, and the drain region is in the third portion of the fin, such that a first ridge of the first pattern includes at least a portion of the source region and a second ridge of the first pattern includes at least a portion of the drain region.

16. The device of claim 15 wherein the first portion of first fin that has the gate dielectric thereon is located between a pair of ridges or nodules.

17. The device of claim 13, wherein the first and second fins are at least 200 nm tall, spaced 30 nm or less from one another, and less than 16 nm wide, the spacing and width being measured at a location along the fin height corresponding to a portion of the fin just below a bottom of the gate dielectric.

18. The device of claim 13, wherein:
the first and second fins are at least 20 nm tall, 11 nm or less wide, and spaced less than 55 nm from one another; or the first and second fins are 11 nm or less wide, spaced 30 nm or less from one another, and more than 155 nm tall, and in either case the spacing and width being measured at a location along the fin height corresponding to a portion of the first fin just below a bottom of the gate dielectric.

19. A method for making integrated circuit device, the method comprising:
forming first and second fins above a substrate and adjacent to one another, each of the first and second fins comprising semiconductor material and having a length, a width, and a height, and each of the first and second fins has a morphology configured to reduce inter-fin contact during fin collapse
wherein the morphology of the first fin includes an undulating wave pattern having peaks and troughs that are out of phase with peaks and troughs of an undulating wave pattern of the second fin, such that inter-fin contact between the first fin and second fin during a fin collapse condition prior to formation of source and drain regions is limited by the peaks of the first fin and the troughs of the second fin.

20. The method of claim 19 wherein the fin morphology is provided by extreme ultraviolet lithography (EUV) patterning.

* * * * *